United States Patent
Takeda et al.

(10) Patent No.: US 7,439,578 B2
(45) Date of Patent: Oct. 21, 2008

(54) SEMICONDUCTOR DEVICE

(75) Inventors: Yasuhiro Takeda, Ogaki (JP); Mitsuaki Morigami, Ogaki (JP); Satoru Shimada, Hashima (JP); Kazuhiro Yoshitake, Oota (JP); Shuichi Kikuchi, Gunma-ken (JP); Seiji Otake, Kumagaya (JP); Toshiyuki Ohkoda, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/617,517

(22) Filed: Dec. 28, 2006

(65) Prior Publication Data

US 2007/0166925 A1    Jul. 19, 2007

(30) Foreign Application Priority Data

Dec. 28, 2005  (JP)  ............................. 2005-376788
Mar. 24, 2006  (JP)  ............................. 2006-083269

(51) Int. Cl.
*H01L 29/76*   (2006.01)
*H01L 29/94*   (2006.01)
*H01L 31/062*  (2006.01)
*H01L 31/113*  (2006.01)
*H01L 31/119*  (2006.01)
*H01L 29/06*   (2006.01)

(52) U.S. Cl. ........................ 257/328; 257/327; 257/401; 257/618; 257/622

(58) Field of Classification Search ......... 257/327–328, 257/401, 618, 622

See application file for complete search history.

(56) References Cited

U.S. PATENT DOCUMENTS

| | | | | |
|---|---|---|---|---|
| 6,455,902 | B1 * | 9/2002 | Voldman | 257/378 |
| 6,773,995 | B2 * | 8/2004 | Shin et al. | 438/270 |
| 2004/0232522 | A1 * | 11/2004 | Shimizu | 257/548 |
| 2006/0030111 | A1 * | 2/2006 | Onai et al. | 438/296 |
| 2006/0226474 | A1 * | 10/2006 | Ho et al. | 257/326 |
| 2006/0267044 | A1 * | 11/2006 | Yang | 257/141 |

FOREIGN PATENT DOCUMENTS

| | | |
|---|---|---|
| JP | 06-097450 | 4/1994 |
| JP | 2002-184980 | 6/2002 |
| JP | 2003-303959 | 10/2003 |
| JP | 2003-303960 | 10/2003 |

\* cited by examiner

*Primary Examiner*—Ida M Soward
(74) *Attorney, Agent, or Firm*—Ditthavong Mori & Steiner, P.C.

(57) ABSTRACT

A semiconductor device includes a trench formed in a surface of a semiconductor substrate. A conductor is embedded in the trench. A conductive layer is arranged adjacent to the trench on the surface of the semiconductor substrate. Semiconductor elements, which include sources provided by one of the conductor and the conductive layer and drains provided by the other one of the conductor and the conductive layer, are formed in a semiconductor element formation region. A planar wiring layer is embedded in the semiconductor substrate under the entire semiconductor element formation region and connected to the conductor.

16 Claims, 15 Drawing Sheets

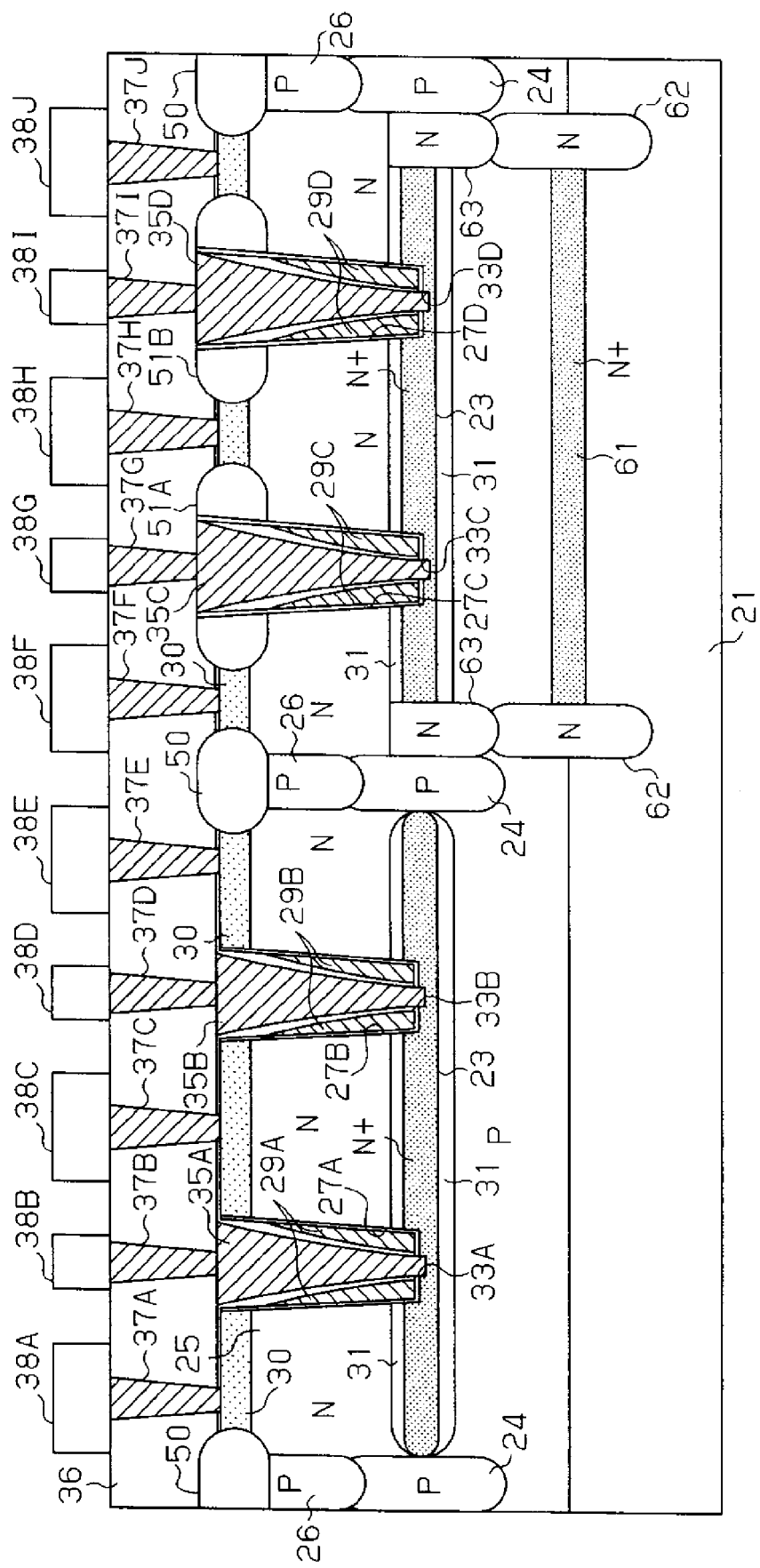

SEMICONDUCTOR DEVICE

CROSS-REFERENCE TO RELATED APPLICATIONS

This application is based upon and claims the benefit of priority from prior Japanese Patent Application Nos. 2005-376788, filed on Dec. 28, 2005, and 2006-083269, filed on Mar. 24, 2006, the entire contents of which are incorporated herein by reference.

BACKGROUND OF THE INVENTION

The present invention relates to a semiconductor device, and more particularly, to a semiconductor device including a plurality of power transistors and formed to enable miniaturization of the power transistors and improve operational stability of the power transistors.

As electronics devices have been miniaturized and manufactured at lower cost, power transistors mounted on such electronics devices are also required to be miniaturized. In particular, electronics devices having withstand voltages of 100 V or lower, such as portable devices and household appliances, are required to be further miniaturized. Thus, such electronics devices inevitably require techniques for integrating a control circuit and a plurality of power transistors on a single semiconductor substrate. A lateral double diffused metal oxide semiconductor field effect transistor (LDMOS-FET), which is one conventional transistor structure that enables easy integration of a plurality of semiconductor elements, has been widely commercialized.

A typical LDMOSFET has a drift region formed at a drain side to increase its withstand voltage. The drift region is generally required to have a length of approximately 0.067 μm/V. To manufacture an LDMOSFET having a withstand voltage of, for example, 20 V, a drift region having a length of approximately 1.34 micrometers needs to be formed using a submicron fabrication technique. The withstand voltage of the LDMOSFET is improved by forming the drift region at the drain side. However, the drift region limits the miniaturization of the LDMOSFET.

Japanese Patent No. 3348911 and Japanese Laid-Open Patent Publication No. 2002-184980 describe improved DMOSFETs. In such an improved DMOSFET, a source wire and a drain wire are extended from the surface of a substrate, and a trench is formed in the substrate in the depthwise direction of the substrate. A gate electrode is arranged in the trench by an insulation film. Regions close to the side walls of the trench in the semiconductor substrate are formed as a channel layer and a drift layer. This structure miniaturizes the DMOS transistor.

The DMOSFET structures described in Japanese Patent No. 3348911 and Japanese Laid-Open Patent Publication No. 2002-184980 enable reduction in the area occupied by a single semiconductor element on a semiconductor substrate as compared with the conventional LDMOSFET. A plurality of power semiconductor elements are normally connected in parallel to drive a large load. As the area of each semiconductor element decreases, the region in which metal wires are arranged for connection between the semiconductor elements or for connection between each semiconductor element and an external circuit is reduced accordingly. As a result, the wire width decreases, and the wire resistance increases. This causes the problems described below.

The wire resistance causes different voltages to be applied to the semiconductor elements although the same voltage must be applied to each semiconductor element. As a result, current concentrates on a particular portion of the semiconductor elements. The concentration of current may lower the reliability of the semiconductor elements, shorten the meltdown life of the wires, and shorten the electromigration life of the wires. Although the DMOSFET is less likely to have secondary breakdown than a bipolar transistor, the DMOSFET may be broken by such local concentration of current.

SUMMARY OF THE INVENTION

It is an object of the present invention to provide a semiconductor device that reduces uneven current distribution in a plurality of semiconductor elements integrated into the semiconductor device.

One aspect of the present invention is a semiconductor device including a semiconductor substrate having a surface. A trench is formed in the surface of the semiconductor substrate. A conductor is embedded in the trench. A conductive layer is arranged adjacent to the trench on the surface of the semiconductor substrate. Semiconductor elements, which include sources provided by one of the conductor and the conductive layer and drains provided by the other one of the conductor and the conductive layer, are formed in a semiconductor element formation region. A planar wiring layer is embedded in the semiconductor substrate under the entire semiconductor element formation region and connected to the conductor.

In this structure, a planar wiring layer extends under the entire semiconductor element formation region, and the wiring layer is connected to a conductor that functions as a source or a drain. The wiring layer functions as a wide wire. As a result, the wire resistance of each semiconductor element decreases as compared with the above conventional structure. Further, variations in the wire resistance of the semiconductor elements are suppressed. This reduces uneven distribution of current in the semiconductor elements, and consequently improves the reliability of the semiconductor device.

In the present specification, the phrase "under the entire semiconductor element formation region" refers not only to a state in which the formation region of the above wiring layer completely conforms to the semiconductor element formation region but also to a state in which the wiring layer is embedded in a region narrower than the semiconductor element formation region with the wiring layer connected to the conductor. Even when the above wiring layer is embedded in the narrower range than the semiconductor element formation range, this structure reduces uneven distribution of current in the semiconductor elements. Further, even when the wiring layer has a hole or the like, this structure reduces uneven distribution of current in the semiconductor elements.

A further aspect of the present invention is a semiconductor device including a semiconductor substrate having a surface. A trench is formed in the surface of the semiconductor substrate. A gate electrode is embedded in the trench. A conductor is embedded inward from the gate electrode. A conductive layer is arranged adjacent to the trench on the surface of the semiconductor substrate. Semiconductor elements, which include sources provided by one of the conductor and the conductive layer and drains provided by the other one of the conductor and the conductive layer, are formed in a semiconductor element formation region. A planar wiring layer is embedded in the semiconductor substrate under the entire semiconductor element formation region and connected to the conductor.

This structure reduces uneven distribution of current in the semiconductor elements for the same reasons as described above. Further, a gate electrode is embedded in a trench that is formed on the surface of the semiconductor substrate, and a conductor is embedded at a location inward from the gate electrode. Current supplied from the conductor or the conductive layer flows in the depth direction of the semiconductor substrate. Thus, current supplied from the conductor or the conductive layer flows along the surface of the semiconductor substrate. This reduces each semiconductor element formation region as compared with the above LDMOSFET and further miniaturizes the semiconductor device.

A plurality of metal wires connected to the conductor and the conductive layer are arranged on the semiconductor substrate. It is preferred that among the plurality of wires, a metal wire connected to the conductor have a wire width that is narrower than that of a metal wire connected to the conductive layer. In this case, current supplied to each semiconductor element flows through the above wiring layer. This decrease the wire resistance in each semiconductor element. The decrease in the wire resistance reduces the wire width of the metal wires in each semiconductor element, and narrows the pitch of the metal wires. As a result, this structure enables the semiconductor elements of the semiconductor device to be more highly integrated and enables further miniaturization of the semiconductor device.

To maximize the number of semiconductor elements integrated on the semiconductor device, the plurality of semiconductor elements are formed in the trench in the direction of extension of the trench (first direction). In this case, the distribution of current supplied to the semiconductor elements easily varies in the extension direction of the trench. When the ratio of the length of the wiring layer in the trench extension direction relative to the length of the wiring layer in a direction in which the semiconductor elements are arranged (second direction) is one or less, the wiring layer is widened in the trench extension direction. As a result, the wire resistance in the trench extension direction further decreases. This effectively reduces uneven distribution of current in the semiconductor elements.

It is preferred that the above wiring layer be formed by diffusing an impurity into the semiconductor substrate. By forming the wiring layer in such a manner, the difference between the thermal expansion coefficient of the semiconductor substrate and the thermal expansion coefficient of the wiring layer is reduced, and defects or the like are prevented from being generated by such differences in the thermal expansion coefficient. As a result, the manufacturing yield of the semiconductor device is improved.

A semiconductor device of the present invention is manufactured through a process of forming an impurity diffusion layer on a surface of a support substrate that is formed by a semiconductor, a process of forming an epitaxial semiconductor layer on the surface of the support member on which the impurity diffusion layer has been formed, a process of forming a trench on a surface of the epitaxial semiconductor layer, a process of embedding a gate electrode in an inner wall of the trench, a process of forming a groove that extends from a bottom surface of the trench in which the gate electrode is embedded to the impurity diffusion layer, a process of embedding a conductor in a manner that the conductor is connected to the impurity diffusion layer through an inner portion of the trench that is inward from the gate electrode and an inner portion of the groove, a process of forming a conductive layer adjacent to the trench on a surface of the semiconductor substrate, and a process of connecting a source electrode to one of the conductor and the conductive layer and a drain electrode to the other one of the conductor and the conductive layer.

With this manufacturing method, an impurity diffusion layer is first formed on a surface of a support substrate that is formed by a semiconductor, and an epitaxial semiconductor layer is formed on the surface of the support substrate on which the impurity diffusion layer has been formed. A conductor is embedded in a manner that the conductor is connected to the impurity diffusion layer through an inner portion of a groove, which is formed to extend from a bottom surface of a trench formed on a surface of the epitaxial semiconductor layer to the impurity diffusion layer. As a result, the wiring layer is formed in the semiconductor substrate that is formed by the support substrate and the epitaxial semiconductor layer. A gate electrode is embedded in an inner wall of the trench, and a source electrode is connected to one of a conductive layer, which is formed adjacent to the trench on a surface of the epitaxial semiconductor layer, and the conductor, and a drain electrode is connected to the other one of the conductive layer and the conductor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 37 is a cross-sectional view of a semiconductor device according to another embodiment of the present invention.

DETAILED DESCRIPTION OF THE PREFERRED EMBODIMENTS

A semiconductor device according to a first embodiment of the present invention will now be described with reference to FIGS. 1 to 13.

Figure 1:
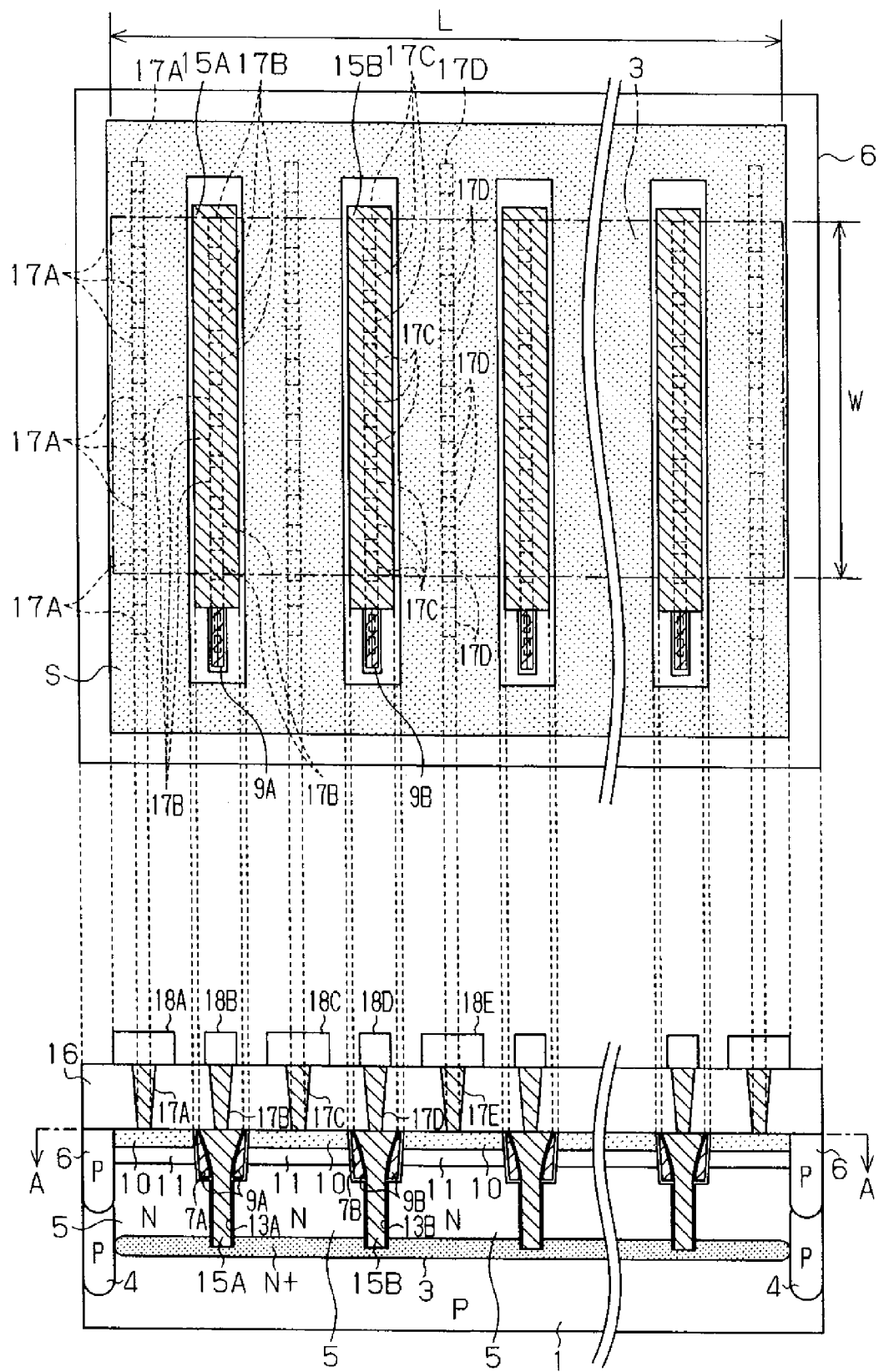
FIG. 1 shows in its lower portion a cross-sectional view of a semiconductor device according to a first embodiment of the present invention and shows in its upper portion a plan view of the semiconductor device taken at a depth along line A-A in the lower portion.

The structure of the semiconductor device according to the first embodiment will now be described with reference to FIG. 1. FIG. 1 shows the cross-sectional structure of elements in the semiconductor device and also shows the cross-sectional structure of a plane taken along line A-A in the drawing.

As shown in FIG. 1, the semiconductor device of the first embodiment includes isolation diffusion layers 4 and 6 having the form of a rectangular frame and isolating a plurality of semiconductor elements. A region surrounded by the isolation diffusion layers 4 and 6 functions as a semiconductor element formation region S. A plurality of double diffused metal oxide semiconductor field effect transistors (DMOSFETs) are arranged in the semiconductor element formation region S. The DMOSFETs in the first embodiment are power transistors. A power transistor typically has a total gate width of several millimeters and is long. Thus, wire resistance is problematic. Accordingly, as shown in the upper portion of FIG. 1, the semiconductor device formed by integrating the plurality of power DMOSFETs normally employs a multi-finger structure in which sources and drains are alternately arranged. The multi-finger structure may include several hundreds fingers, each of which is formed by a set of a source and a drain, arranged in the direction in which the sources and the drains are arranged in parallel. For the sake of brevity, the structure of the DMOSFETs in the first embodiment will be described focusing on only four of the several hundreds fingers.

FIG. 1 shows a cross-sectional structure of the DMOSFETs in the first embodiment. The DMOSFETs in the first embodiment include an n-type buried diffusion layer 3 formed on the upper surface of a p-type silicon substrate 1. An n-type epitaxial silicon layer 5 is formed on the upper surface of the n-type buried diffusion layer 3. In the first embodiment, the p-type silicon substrate 1 and the n-type epitaxial silicon layer 5 form a semiconductor substrate. More specifically, the n-type buried diffusion layer 3 is planar and extends under the entire semiconductor device formation region S in the semiconductor substrate. As shown in the upper portion of FIG. 1, the n-type buried diffusion layer 3 has a first dimension (L) in the direction in which the DMOSFETs are arranged and a second dimension (W) measured in the direction in which trenches 7A and 7B extend. The ratio of the second dimension to the first dimension is less than 1, or satisfies the expression of:

$$W/L<1.$$

In the example of FIG. 1, the n-type buried diffusion layer 3 is rectangular, and the arrangement direction of the DMOSFETs is perpendicular to the extension direction of the trenches 7A and 7B. The impurity concentration of the n-type buried diffusion layer 3 is set to be higher than that of the epitaxial silicon layer 5.

As shown in the lower portion of FIG. 1, a p-type body diffusion layer 11 and an n-type source diffusion layer 10 are sequentially formed on the upper surface of the n-type epitaxial silicon layer 5. The trenches 7A and 7B are formed in parallel to each other on the upper surface of the n-type epitaxial silicon layer 5. Gate electrodes (trench gate electrodes) 9A and 9B are respectively formed along the inner walls of the trenches 7A and 7B by way of an insulation film made of, for example, silicon dioxide. The gate electrodes (trench electrodes) 9A and 9B partially fill the trenches 7A and 7B. Although the gate electrodes 9A and 9B are shown having two portions facing toward each other in the lower portion of FIG. 1, the two portions of the gate electrodes 9A and 9B are actually joined at the lower ends of the corresponding trenches 7A and 7B, as shown in the upper portion of FIG. 1. As indicated by broken lines in FIG. 1, conductive contact plugs connected to metal wires for the gate electrodes are arranged on the gate electrodes 9A and 9B that are joined at the lower ends of the trenches 7A and 7B. The contact plugs are electrically connected to the gate electrodes 9A and 9B, and the metal wires for the gate electrodes are electrically connected to the gate electrodes 9A and 9B.

As shown in the lower portion of FIG. 1, the n-type epitaxial silicon layer 5 has relatively narrow grooves 13A and 13B that are formed to extend from the bottom surfaces of the trenches 7A and 7B to the n-type buried diffusion layer 3. Drain lead electrodes 15A and 15B are embedded in the n-type epitaxial silicon layer 5 in a manner that the drain lead electrodes 15A and 15B are connected to the n-type buried diffusion layer 3 through the inner portions of the gate electrodes 9A and 9B in the trenches 7A and 7B and the inner portions of the grooves 13A and 13B.

An interlayer insulation film 16 is formed on the upper surface of the n-type epitaxial silicon layer 5. Contact plugs 17A, 17C, and 17E connected to the source diffusion layer 10 and contact plugs 17B and 17D connected to the drain lead electrodes 15A and 15B are embedded in the interlayer insulation film 16. Metal wires 18A to 18E respectively connected to the contact plugs 17A to 17E are formed on the upper surface of the interlayer insulation film 16.

In these DMOSFETs, when voltage is applied between the metal wires 18B and 18D and the metal wires 18A, 18C, and 18E and channels are formed in the body diffusion layer 11 along the side walls of the trenches 7A and 7B through voltage control of the gate electrodes 9A and 9B, current flows through the n-type buried diffusion layer 3.

In detail, a carrier injected from the metal wire 18A flows along a path extending through the source diffusion layer 10, a channel formed in the body diffusion layer 11 in the vicinity of the left side wall of the trench 7A as viewed in the drawing, the n-type buried diffusion layer 3, the drain lead electrode 15A, the contact plug 17B, and the metal wire 18B. A carrier injected from the metal wire 18C first flows through the source diffusion layer 10 and then flows into the n-type buried diffusion layer 3 through a channel formed in the body diffusion layer 11 in the vicinity of the right side wall of the trench 7A as viewed in the drawing and a channel formed in the body diffusion layer 11 in the vicinity of the left side wall of the trench 7B as viewed in the drawing. A carrier injected from the metal wire 18C flows from the n-type buried diffusion layer 3 to the drain lead electrode 18A, the contact plug 17B, and the metal wire 18B, and also flows from the n-type buried diffusion layer 3 to the drain lead electrode 15B, the contact plug 17D, and the metal wire 18D. In this manner, the carriers injected from the metal wires 18A, 18C, and 18E that are electrically connected to the source diffusion layer 10 all flow through the n-type buried diffusion layer 3. The n-type buried diffusion layer 3 is planar and formed under the entire semiconductor element formation region S of the DMOSFETs as described above. Thus, the wire resistance of each DMOSFET decreases as compared with the conventional semiconductor device, and the wire resistance of each DMOSFET is prevented from varying. This reduces uneven distribution of current in the DMOSFETs, and prevents the current from concentrating at a certain portion of the semiconductor device.

The processes for manufacturing the semiconductor device in the first embodiment will now be described with reference to FIGS. 2 to 12. FIGS. 2 to 12 schematically show the cross-sectional structure of the semiconductor device in the first embodiment during the manufacturing process.

Figure 2:
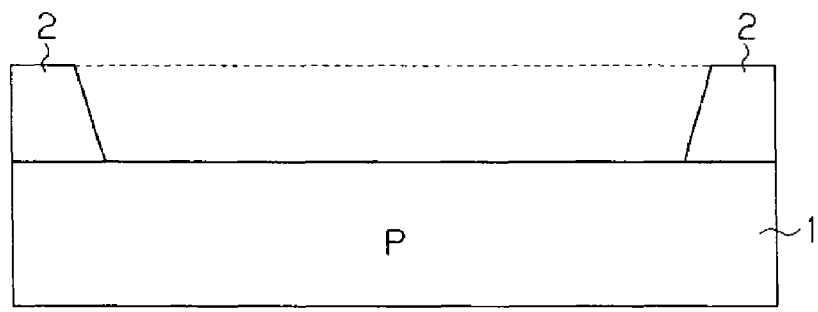
FIGS. 2 to 12 are cross-sectional views of the semiconductor device in the first embodiment showing various procedures during its manufacturing process.

Process 1: As shown in FIG. 2, a p-type silicon substrate 1 is first prepared. The upper surface of the p-type silicon substrate 1 is thermally oxidized to form a thermal oxidation film 2 having a thickness of approximately 6000 angstroms. Afterwards, a portion of the thermal oxidation film 2 having a surface area conforming to a first dimension L and a second dimension W is removed by performing photolithography and wet etching as indicated in broken line in FIG. 2. More specifically, a photosensitive resin (photoresist) is first applied to the upper surface of the p-type silicon substrate 1. When a positive photoresist is used as the photoresist, a photomask having an opening corresponding to the region having the first dimension L and the second dimension W is placed on the p-type silicon substrate 1, and ultraviolet rays or excimer laser beams are emitted toward the photoresist from above the p-type silicon substrate 1 through the photomask to transfer the pattern of the photomask onto the photoresist. Afterwards, the photoresist is developed to form a resist pattern on the upper surface of the p-type silicon substrate 1. The resist pattern is then subjected to wet etching by spraying an etching solution from above the p-type silicon substrate 1 through the resist pattern. This removes a portion of the thermal oxidation film 2 as indicated in broken line in FIG. 2.

Figure 3:
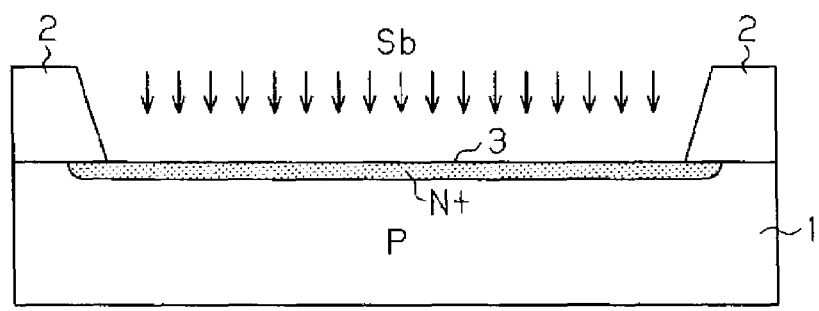

Process 2: As shown in FIG. 3, an antimony (Sb) source is applied by performing spin coating in the direction indicated by arrows on the region from which the portion of the thermal oxidation film 2 has been removed in process 1. In other words, the antimony source is applied to an upper surface portion of the p-type silicon substrate 1 surrounded by the thermal oxidation film 2. Afterwards, the applied antimony is subjected to heat treatment at approximately 1250° C. As a result, an n-type buried diffusion layer 3 having a sheet resistance of approximately 20 Ω/□ (square) is formed. The sheet resistance of the n-type buried diffusion layer 3 is determined by the temperature and the time of the heat treatment.

Figure 4:
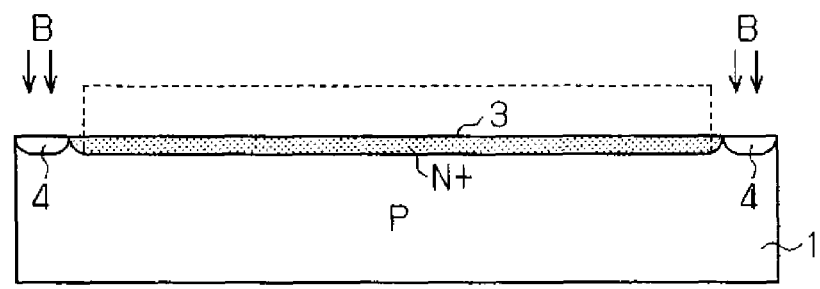

Process 3: The thermal oxidation film 2 is removed, and then a mask covering the upper surface of the n-type buried diffusion layer 3 is formed by performing photolithography as indicated by broken lines in FIG. 4. As shown in FIG. 4, boron (B) is ion-implanted into the upper surface of the p-type silicon substrate 1 in the direction indicated by arrows and activated by a heat treatment. As a result, an isolation diffusion layer 4 surrounding the n-type buried diffusion layer 3 is formed.

Figure 5:
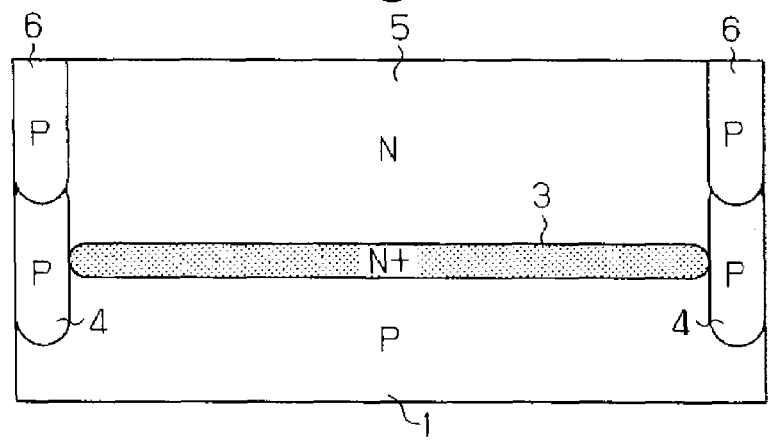

Process 4: As shown in FIG. 5, an n-type epitaxial silicon layer 5 having a specific resistance of approximately 1 to 2 Ω·cm is formed to have a film thickness of approximately 2 micrometers. Then, a mask covering the upper surface of the n-type buried diffusion layer 3 is formed by performing photolithography in the same manner as in process 3. Boron is ion-implanted into the upper surface of the n-type epitaxial silicon layer 5 and activated by a heat treatment. As a result, an isolation diffusion layer 6 that extends to the isolation diffusion layer 4 is formed, and the isolation diffusion layer 4 and the isolation diffusion layer 6 define the range of the n-type epitaxial silicon layer 5. In the first embodiment, the n-type epitaxial silicon layer 5 has a thickness of as large as approximately 2 micrometers. In this case, the isolation of the semiconductor elements may be incomplete when using only the isolation diffusion layer 4. Thus, to completely isolate the semiconductor elements, the isolation diffusion layer 6 is additionally formed to extend downward from the upper surface of the n-type epitaxial silicon layer 5.

Figure 6:
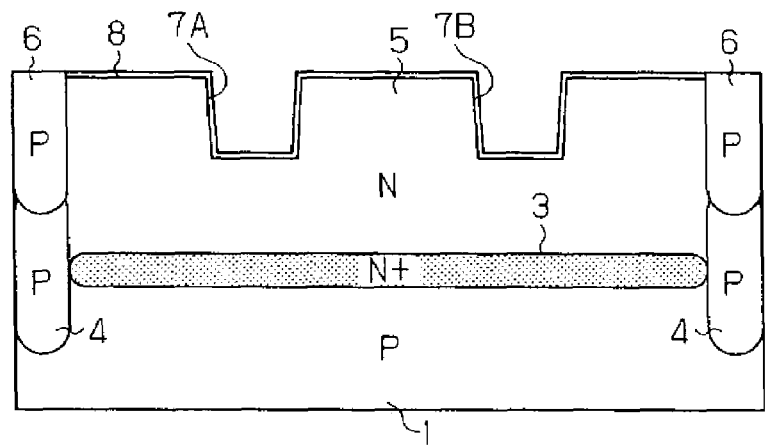

Process 5: As shown in FIG. 6, trenches 7A and 7B having a width of approximately 1.5 micrometers and a depth of approximately 1 micrometer are formed in the upper surface of the n-type epitaxial silicon layer 5 by performing photolithography and etching. Afterwards, the upper surface of the n-type epitaxial silicon layer 5 is thermally oxidized to form a gate insulation film 8 having a thickness of approximately 150 angstroms. In the first embodiment, the semiconductor device has the multi-finger structure described above. Thus, the trenches must be formed in a quantity that is the same as the quantity of the fingers. However, only two of the trenches are shown in FIG. 6.

Figure 7:
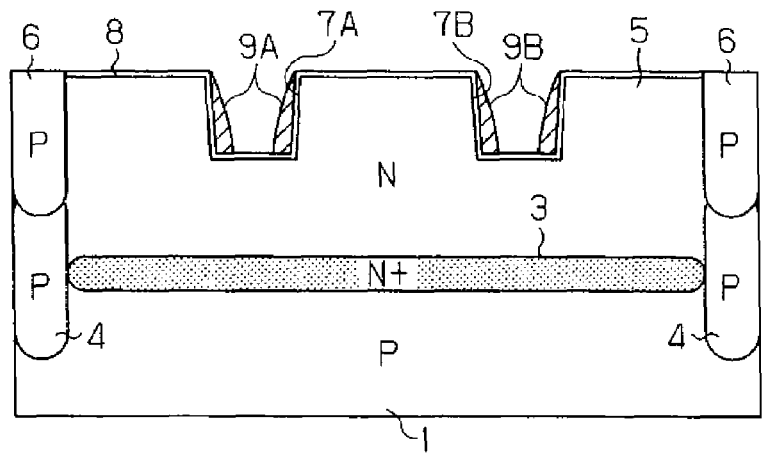

Process 6: Polysilicon is deposited in the trenches 7A and 7B to a thickness of approximately 2000 angstroms and then subjected to heat treatment using a phosphor source such as $POCl_3$ (phosphorous oxychloride) to dope the polysilicon with phosphorous (P). Afterwards, anisotropic RIE (reactive ion etching) is performed to form a gate electrode 9A as a side wall on the inner wall of the trench 7A and a gate electrode 9B as a side wall on the inner wall of the trench 7B as shown in FIG. 7.

Figure 8:
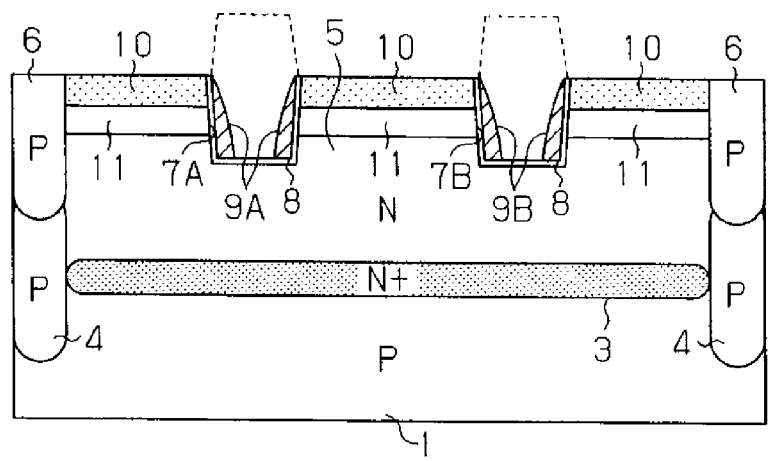

Process 7: The gate insulation film 8 formed on the upper surface of the source diffusion layer 10 is removed. Then, a resist pattern closing the openings of the trenches 7A and 7B is formed by performing photolithography as indicated by broken lines in FIG. 8. As shown in FIG. 8, arsenic (As) is ion-implanted into the upper surface of the n-type epitaxial silicon layer 5 via the resist pattern, and boron is ion-implanted at a position deeper than the position at which arsenic has been implanted. Afterwards, the implanted elements are activated by a heat treatment. As a result, an n-type source diffusion layer 10 and a p-type body diffusion layer 11 functioning as a base layer of the source diffusion layer 10 are formed in the n-type epitaxial silicon layer 5.

Figure 9:
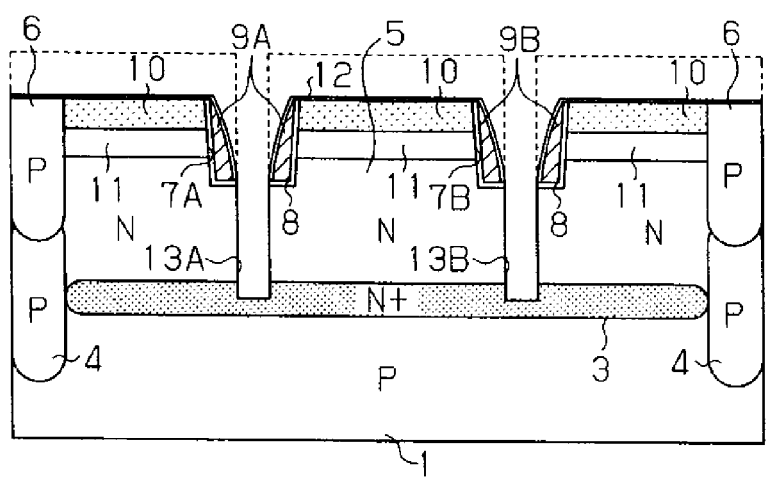

Process 8: As shown in FIG. 9, an interlayer insulation film 12 is deposited to a thickness of approximately 1000 angstroms from above the n-type epitaxial silicon layer 5 by performing, for example, LP-CVD (low pressure chemical vapor deposition) using TEOS (tetraethoxysilane). More specifically, the interlayer insulation film 12 is formed to cover the upper surface of the source diffusion layer 10, the surfaces of the gate electrodes 9A and 9B, and the upper surfaces of the gate insulation film 8 formed on the bottom surfaces of the trenches 7A and 7B. Afterwards, as indicated by broken lines in FIG. 9, a resist pattern having an opening corresponding to an area between the opposed portions of the gate electrode 9A in the trench 7A and an opening corresponding to an area between the opposed portions of the gate electrode 9B in the trench 7B is formed by performing photolithography. Etching is performed through the resist pattern so that the bottom surfaces of the trenches 7A and 7B are cut out and grooves 13A and 13B having a depth of approximately 1 micrometer are formed extending from the bottom surfaces of the trenches 7A and 7B to the n-type buried diffusion layer 3. Thus, the grooves 13A and 13B extend from the bottom surfaces of the trenches 7A and 7B, in which the gate electrodes 9A and 9B are embedded, to the n-type buried diffusion layer 3.

Figure 10:
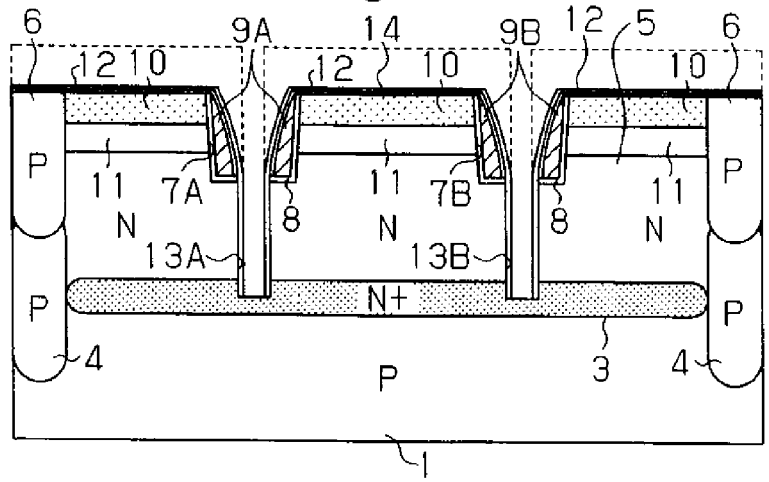

Process 9: As shown in FIG. 10, an interlayer insulation film 14 is deposited to a thickness of approximately 1000 angstroms from above the n-type epitaxial silicon layer 5 by performing, for example, LP-CVD using TEOS in the same manner as described above. More specifically, the interlayer insulation film 14 is formed to cover the upper surface of the interlayer insulation film 12, the inner walls of the grooves 13A and 13B, and the bottom surfaces of the grooves 13A and 13B. Afterwards, a resist pattern having openings corresponding to the bottom surfaces of the grooves 13A and 13B is formed by performing photolithography. Etching is performed through this resist pattern to remove portions of the interlayer insulation film 14 formed on the bottom surfaces of the grooves 13A and 13B.

Figure 11:
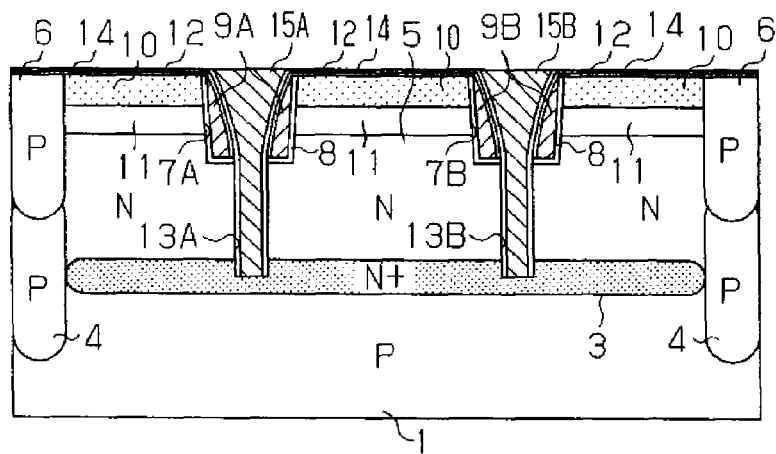

Process 10: As shown in FIG. 11, after forming a barrier metal of titanium nitride (TiN) or the like, tungsten (W) is deposited in the trenches 7A and 7B and in the grooves 13A and 13B by performing CVD (chemical vapor deposition) using tungsten hexafluoride (WF6) gas. By performing photolithography and etching, a drain lead electrode 15A is formed in an inner portion of the trench 7A that is inward from the gate electrode 9A and in an inner portion of the groove 13A, and a drain lead electrode 15B is formed in an inner portion of the trench 7B that is inward from the gate electrode 9B and in an inner portion of the groove 13B. This forms the drain lead electrodes 15A and 15B that are connected to the n-type buried diffusion layer 3 through the inner portions of the trenches 7A and 7B inward from the gate electrodes 9A and 9B and the inner portions of the grooves 13A and 13B.

Figure 12:
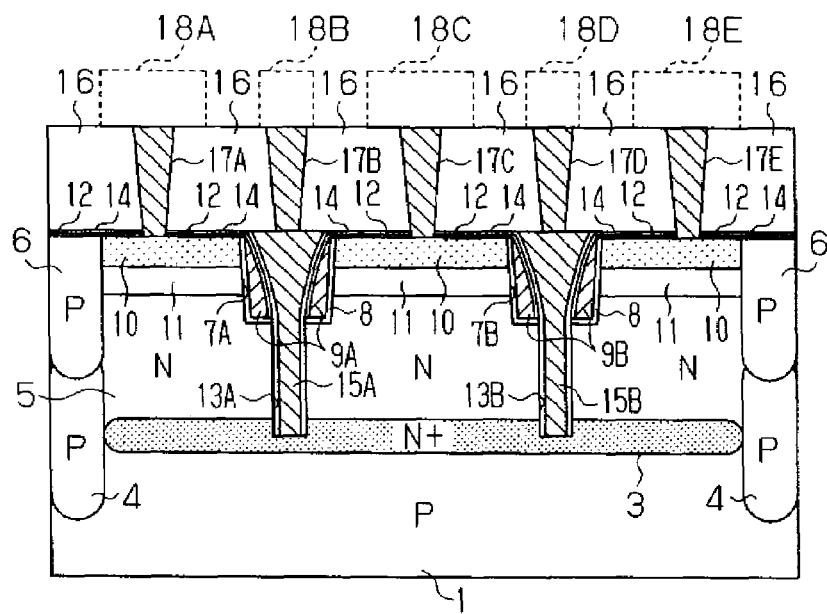

Process 11: As shown in FIG. 12, an interlayer insulation film 16 is formed on the n-type epitaxial silicon layer 5 by performing, for example, HDP-CVD (high-density plasma chemical vapor deposition). Afterwards, contact holes extending to the source diffusion layer 10 and the drain lead electrodes 15A and 15B are formed in the interlayer insulation film 16. Tungsten is deposited in the contact holes by performing CVD using tungsten hexafluoride gas and etched back to form contact plugs 17A to 17E in the contact holes. As indicated by broken lines, a laminated film of TiN/Al—Cu/TiN is deposited to a total film thickness of approximately 5000 angstroms by performing sputtering. Then, photolithography and etching are performed to form metal wires 18A to 18E that are electrically connected to the contact plugs 17A to 17E, respectively. The semiconductor device of the first embodiment uses aluminum (Al) as the material for the metal wires 18A to 18E. The main structure of the semiconductor device of the first embodiment is completed through the processes described above.

When, for example, this semiconductor device has a multi-finger structure with 100 fingers and a total gate width of 1000 micrometers, the gate width per DMOSFET is 100 micrometers (the total gate width of 1000 μm/100 fingers). When the width of the metal wires 18A to 18E of the sources and the drains is 0.5 micrometers and the sheet resistance of aluminum is 0.1 Ω/□, the wire resistance of each of the metal wires 18A to 18E is 20 Ω (aluminum sheet resistance 0.1 Ω/□×gate width per DMOSFET of 100 micrometers/metal wire width of 0.5 micrometers). The wire resistance of each of the metal wires 18A to 18E is substantially equal to the resistance of the n-type buried diffusion layer 3 when the n-type buried diffusion layer 3 has a square shape, that is, when the first dimension L and the second dimension W of the n-type buried diffusion layer 3 are equal to each other.

The semiconductor device of the first embodiment has the first dimension L and the second dimension W of its n-type buried diffusion layer 3 satisfying the expression W/L<1. Thus, the n-type buried diffusion layer 3 functions as a wide wire in the direction in which the trenches 7A and 7B extend. As a result, the resistance of the n-type buried diffusion layer 3 further decreases in the extension direction of the trenches 7A and 7B. This reduces uneven distribution of current in the DMOSFETs.

Figures 13A, 13B, 13C:
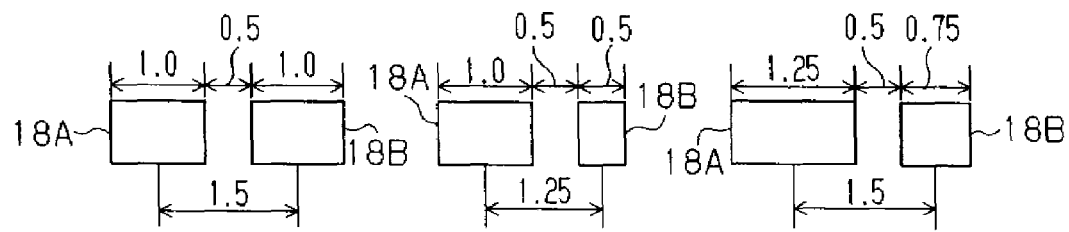
FIGS. 13A, 13B, and 13C show layout examples of metal wires included in the semiconductor device of the first embodiment.

The above-described structure of the semiconductor device is advantageous in the following points. In a conventional semiconductor device, the width of each metal wire is 1.0 micrometer, the minimum space rule of these metal wires is 0.5 micrometer, and the pitch of the transistor metal wires is 1.5 micrometers as shown in FIG. 13A. In contrast, the semiconductor device of the first embodiment has a lower wire resistance and thus the metal wires, connected to embedded conductor and the buried diffusion layer, may have a metal wire width of 0.5 micrometers and a metal wire pitch of 1.25 micrometers. When the semiconductor device of the first embodiment employs the same metal wire pitch as the conventional semiconductor device, the metal wire width at the source side may be increased to 1.25 micrometers and the metal wire width at the drain side may be increased to 0.75 micrometers. This reduces uneven distribution of current in the semiconductor elements, and improves the reliability of the semiconductor device.

In the first embodiment, the drain lead electrodes 15A and 15B correspond to a conductor, the source diffusion layer 10 corresponds to a conductive layer, and the n-type buried diffusion layer 3 corresponds to a wiring layer. In the first embodiment, the n-type epitaxial silicon layer 5 corresponds to an epitaxial semiconductor layer, the metal wires 18B and 18D correspond to a drain electrode, and the metal wires 18A, 18C, and 18E correspond to a source electrode.

The semiconductor device of the first embodiment has the advantages described below.

(1) The n-type buried diffusion layer 3 is formed on the upper surface of the p-type silicon substrate 1 and the n-type epitaxial silicon layer 5 is formed on the n-type buried diffusion layer 3 in a manner that the planar n-type buried diffusion layer 3 is formed in the semiconductor substrate under the semiconductor element formation region S in which the DMOSFETs are formed. The drain lead electrodes 15A and 15B are embedded in the trenches 7A and 7B, which are formed in the n-type epitaxial silicon layer 5, and in the grooves 13A and 13B, which connect the bottom surfaces of the trenches 7A and 7B and the n-type buried diffusion layer 3, so that the drain lead electrodes 15A and 15B are connected to the n-type buried diffusion layer 3. With this structure, the carriers injected from the metal wires 18A, 18C, and 18E, which are electrically connected to the source diffusion layer 10, all flow through the n-type buried diffusion layer 3. This decreases the wire resistance of each DMOSFET as compared with the conventional semiconductor device, and variations in the wire resistance of the DMOSFETs are suppressed. As a result, uneven distribution of current in the DMOSFETs is suppressed, and current is prevented from concentrating at a particular portion of the semiconductor device. This improves the reliability of the semiconductor device.

(2) The n-type buried diffusion layer 3 that is embedded in the semiconductor substrate has the first dimension L measured in the direction in which the DMOSFETs are arranged and the second dimension W measured in the direction in which the trenches 7A and 7B extend. The first dimension L and the second dimension W satisfy the expression W/L<1. Thus, the n-type buried diffusion layer 3 functions as a wide wire in the extension direction of the trenches 7A and 7B. As a result, the resistance of the n-type buried diffusion layer 3 further decreases in the extension direction of the trenches 7A and 7B. This reduces uneven distribution of current in the DMOSFETs.

(3) The contact plugs 17A, 17C, and 17E connecting the source diffusion layer 10 and the metal wires 18A, 18C, and 18E and the contact plugs 17B and 17D connecting the drain lead electrodes 15A and 15B and the metal wires 18B and 18D are made of tungsten, which is a metal. Thus, the wire resistance of the semiconductor substrate further decreases. This reduces uneven distribution of current in the DMOSFETs.

A semiconductor device according to a second embodiment of the present invention will now be described. The semiconductor device of the second embodiment is similar to the semiconductor device of the first embodiment. However, in the semiconductor device of the second embodiment, a source lead electrode that is connected to an n-type buried diffusion layer is embedded in a trench of each DMOSFET. The semiconductor device of the second embodiment will now be described with reference to FIGS. 14 to 25. Components in the semiconductor device of the second embodiment similar to the components of the semiconductor device in the first embodiment will not be described.

Figure 14:
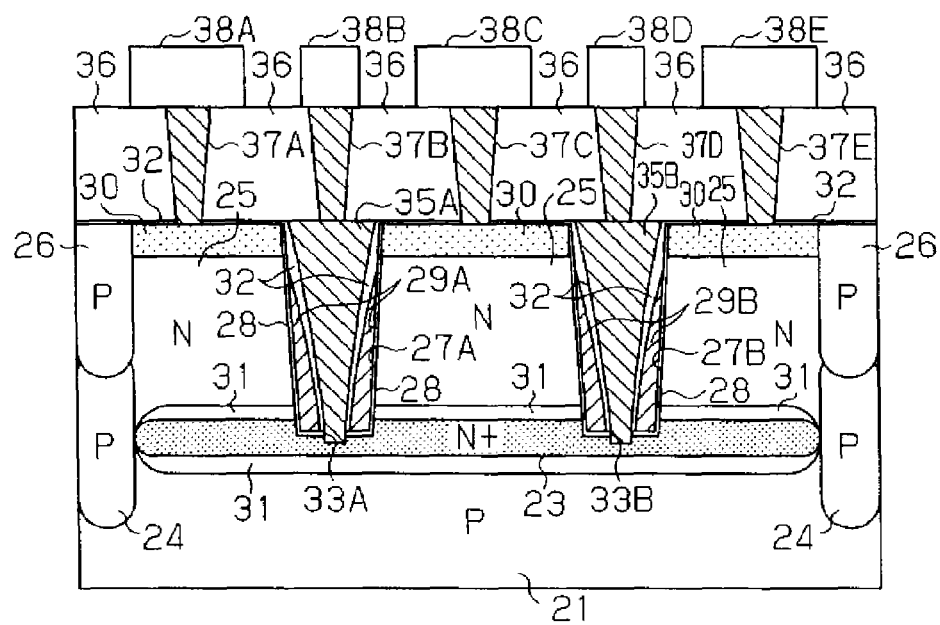
FIG. 14 is a cross-sectional view of a semiconductor device according to a second embodiment of the present invention.

Referring to FIG. 14, the semiconductor device of the second embodiment also includes a plurality of DMOSFETs that are isolated by isolation diffusion layers 24 and 26. A region surrounded by the isolation diffusion layers 24 and 26 is a semiconductor element formation region S in which the DMOSFETs are formed. The semiconductor device of the second embodiment also has a multi-finger structure in which sources and drains are alternately arranged. The structure of the DMOSFETs of the second embodiment will now be described focusing on four of the several hundred fingers included in the multi-finger structure in the same manner as in the first embodiment.

The DMOSFETs shown in FIG. 14 include a body diffusion layer 31, an n-type buried diffusion layer 23, and a body diffusion layer 31 sequentially formed on the upper surface of a p-type silicon substrate 21, and an n-type epitaxial silicon layer 25 formed on the upper surface of the body diffusion layer 31. The p-type silicon substrate 21 and the n-type epitaxial silicon layer 25 form a semiconductor substrate in the second embodiment. The n-type buried diffusion layer 23 is planar and extends in the semiconductor substrate under the entire semiconductor element formation region S of the DMOSFETs in the same manner as in the first embodiment. The n-type buried diffusion layer 23 is formed in a manner that the ratio of its length in the direction in which the DMOSFETs are arranged to its second dimension measured in the direction in which trenches 27A and 27B extend is smaller than 1. More specifically, the n-type buried diffusion layer 23 has a first dimension L measured in the arrangement direction of the DMOSFETs and a second dimension W measured in the extension direction of the trenches 7A and 7B, and the first dimension L and the second dimension W satisfy the expression W/L<1. The impurity concentration of the n-type buried diffusion layer 23 is higher than the impurity concentration of the n-type epitaxial silicon layer 25.

An n-type drain diffusion layer 30 is formed on the upper surface of the n-type epitaxial silicon layer 25. Trenches 27A and 27B extending to the n-type buried diffusion layer 23 are arranged in parallel in the upper surface of the n-type epitaxial silicon layer 25, and gate electrodes 29A and 29B are embedded in inner walls of the trenches 27A and 27B by way of an insulation film made of, for example, silicon dioxide. Grooves 33A and 33B are formed on the bottom surfaces of the trenches 27A and 27B. The grooves 33A and 33B do not extend through the n-type buried diffusion layer 23. In the example shown in the drawings, the grooves 33A and 33B are entirely arranged within the n-type buried diffusion layer 23. In this semiconductor substrate, source lead electrodes 35A and 35B are embedded in a manner that the source lead electrodes 35A and 35B are connected to the n-type buried diffusion layer 23 through inner portions of the trenches 27A and 27B that are inward from the gate electrodes 29A and 29B and inner portions of the grooves 33A and 33B.

An interlayer insulation film 36 is formed on the upper surface of the n-type epitaxial silicon layer 25. Contact plugs 37A, 37C, and 37E connected to the drain diffusion layer 30 and contact plugs 37B and 37D connected to the source lead electrodes 35A and 35B are embedded in the interlayer insulation film 36. Metal wires 38A to 38E connected to the contact plugs 37A to 37E are formed on the upper surface of the interlayer insulation film 36.

In these DMOSFETs as well, voltage is applied between the metal wires 38B and 38D and the metal wires 38A, 38C, and 38E and channels are formed in the body diffusion layer 31 along the side walls of the trenches 27A and 27B through voltage control of the gate electrodes 29A and 29B so that current flows through the n-type buried diffusion layer 23.

In detail, a carrier injected from the metal wire 38B flows through a path formed by the source lead electrode 35A, the n-type buried diffusion layer 23, the channel formed in the body diffusion layer 31 in the vicinity of the left side wall of the trench 27A as viewed in the drawing, the n-type epitaxial silicon layer 25, the drain diffusion layer 30, the contact plug 37A, and the metal wire 38A. The carrier injected from the metal wire 38B also flows through a path formed by the n-type buried diffusion layer 23, the channel formed in the body diffusion layer 31 in the vicinity of the right side wall of the trench 27A as viewed in the drawing, the n-type epitaxial silicon layer 25, the drain diffusion layer 30, the contact plug 37C, and the metal wire 38C. In the same manner, a carrier injected from the metal wire 38D flows through a path formed by the source lead electrode 35B, the n-type buried diffusion layer 23, the channel formed in the body diffusion layer 31 in the vicinity of the left side wall of the trench 27B as viewed in the drawing, the n-type epitaxial silicon layer 25, the drain diffusion layer 30, the contact plug 37C, and the metal wire 38C. The carrier injected from the metal wire 38D also flows through a path formed by the n-type buried diffusion layer 23, the channel formed in the body diffusion layer 31 in the vicinity of the right side wall of the trench 27B as viewed in the drawing, the n-type epitaxial silicon layer 25, the drain diffusion layer 30, the contact plug 37E, and the metal wire 38E.

In this manner, the carriers injected from the metal wires 38B and 38D that are electrically connected to the source lead electrodes 35A and 35B all flow through the n-type buried diffusion layer 23. The n-type buried diffusion layer 23 is planar and extends under the entire semiconductor element formation region S of the DMOSFETs as described above. Thus, the wire resistance of each DMOSFET decreases as compared with the conventional semiconductor device, and variations in the wire resistance of the DMOSFETs are suppressed. This reduces uneven distribution of current in the DMOSFETs, and prevents the current from concentrating at a certain portion of the semiconductor device.

The processes for manufacturing the semiconductor device according to the second embodiment will now be described with reference to FIGS. 15 to 24. FIGS. 15 to 24 schematically show the cross-sectional structure of the semiconductor device of the second embodiment according to its manufacturing processes.

Figure 15:
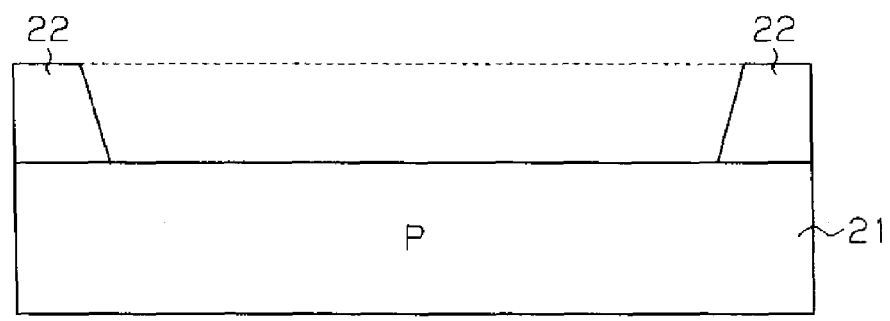
FIGS. 15 to 24 are cross-sectional views of the semiconductor device of FIG. 14 showing various procedures during its manufacturing process.

Process 1: As shown in FIG. 15, a p-type silicon substrate 21 is prepared. The upper surface of the p-type silicon substrate 21 is thermally oxidized to form a thermal oxidation film 22 having a thickness of approximately 6000 angstroms. Afterwards, a portion of the thermal oxidation film 22 having a surface area expressed as a first dimension L and a second dimension W is removed by performing photolithography and wet etching as indicated in broken line in FIG. 15.

Figure 16:
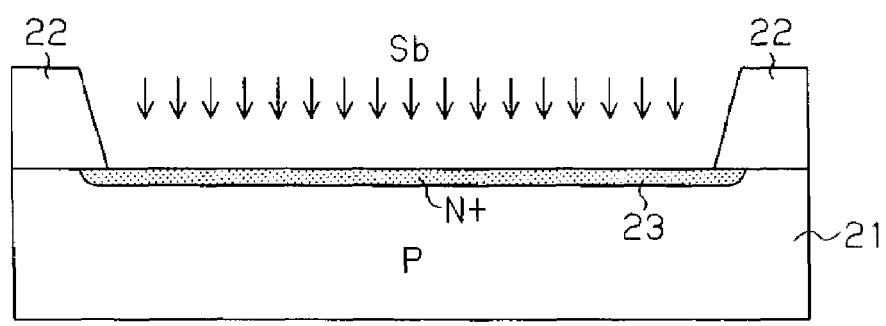
Figure 17:
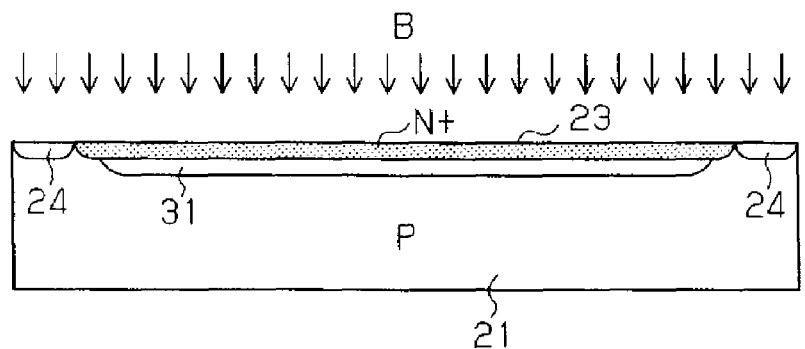

Process 2: As shown in FIG. 16, an antimony source is applied by performing spin coating in a direction indicated by arrows onto a region from which the portion of the thermal oxidation film 22 has been removed in process 1. In other words, the antimony source is applied to an upper surface portion of the p-type silicon substrate 21 surrounded by the thermal oxidation film 22. Afterwards, the applied antimony is subjected to heat treatment at approximately 1250° C. As a result, an n-type buried diffusion layer 23 having a sheet resistance of approximately 20 Ω/☐ is formed. The sheet resistance of the n-type buried diffusion layer 23 is determined by the temperature and the time of the heat treatment in the same manner as in the first embodiment.

Process 3: The thermal oxidation film 22 is removed. Then, a mask having an opening corresponding to the upper surface of the n-type buried diffusion layer 23 is formed by performing photolithography. Boron is ion-implanted into the upper surface of the p-type silicon substrate 21 in the direction indicated by arrows in FIG. 17. Afterwards, a mask covering the upper surface of the n-type buried diffusion layer 23 is formed, and boron is ion-implanted into the upper surface of the p-type silicon substrate 21 in the direction indicated by arrows. Then, the boron implanted in the p-type silicon substrate 21 is activated by a heat treatment. As a result, a p-type body diffusion layer 31 is formed and an isolation diffusion layer 24 surrounding the n-type buried diffusion layer 23 is formed.

Figure 18:
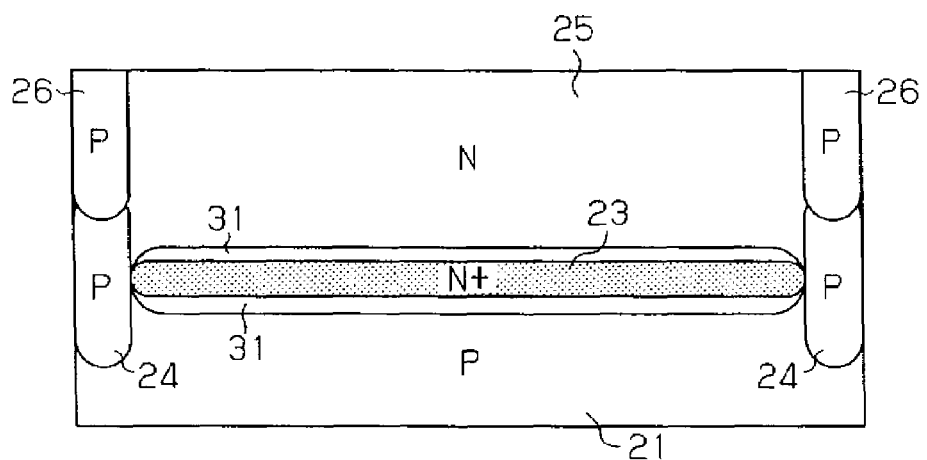

Process 4: As shown in FIG. 18, an n-type epitaxial silicon layer 25 having a specific resistance of approximately 1 to 2 Ω·cm is formed to have a film thickness of approximately 2 micrometers. Then, a mask covering the upper surface of the n-type buried diffusion layer 23 is formed by performing photolithography in the same manner as in process 3. Boron is ion-implanted into the upper surface of the n-type epitaxial silicon layer 25 and activated by a heat treatment. As a result, an isolation diffusion layer 26 that reaches the isolation diffusion layer 24 is formed, and the isolation diffusion layer 24 and the isolation diffusion layer 26 define the range of the n-type epitaxial silicon layer 25.

Figure 19:
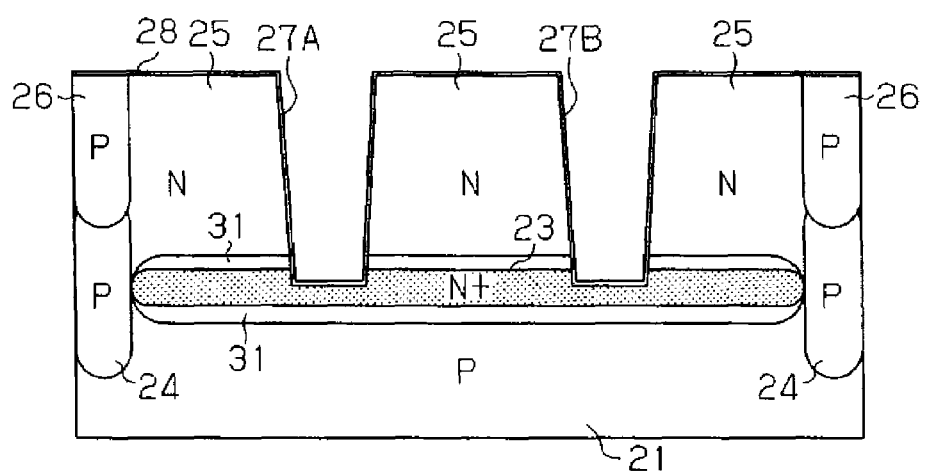

Process 5: As shown in FIG. 19, trenches 27A and 27B having a width of approximately 2.0 micrometers and a depth of approximately 2.0 micrometers that extend to the n-type buried diffusion layer 23 are formed in the upper surface of the n-type epitaxial silicon layer 25 by performing photolithography and etching. Afterwards, the upper surface of the n-type epitaxial silicon layer 25 is thermally oxidized to form a gate insulation film 28 having a thickness of approximately 150 angstroms. In the same manner as in the first embodiment, the trenches must be formed in a quantity that is the same as the quantity of the fingers. However, only two of the trenches are shown for the sake of brevity.

Figure 20:
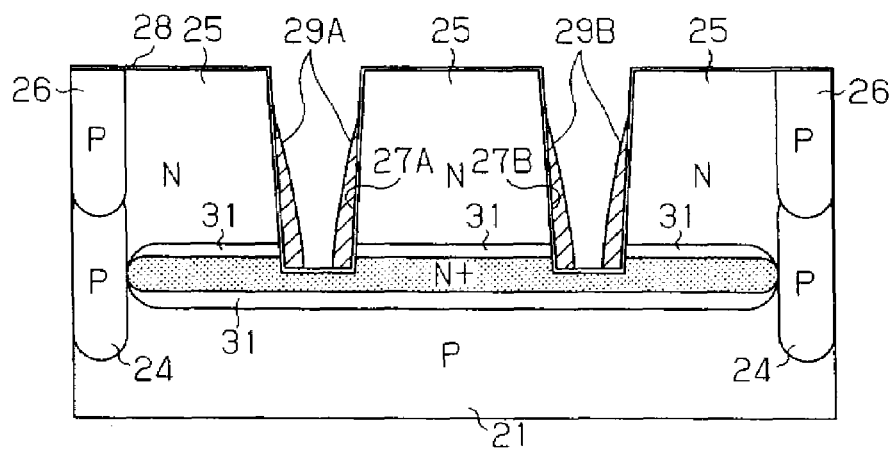
Figure 21:
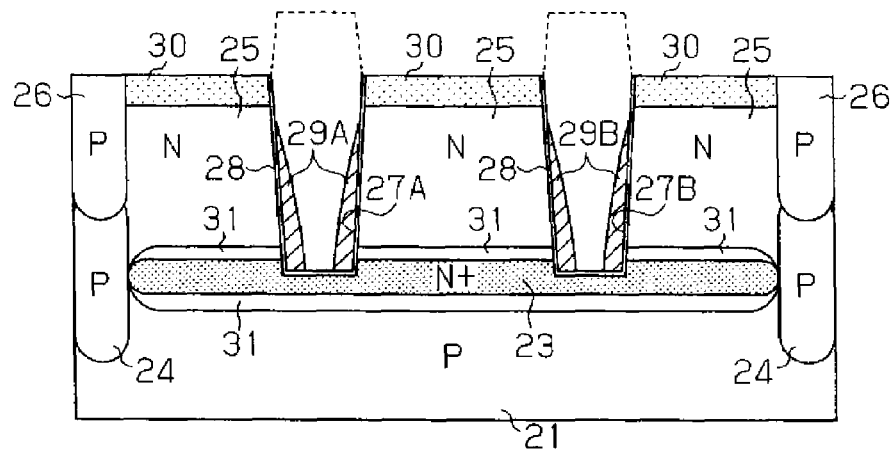

Process 6: Polysilicon is deposited in the trenches 27A and 27B to have a thickness of approximately 2000 angstroms and then subjected to heat treatment using a phosphor source such as $POCl_3$ to dope the polysilicon with phosphorous. Afterwards, anisotropic RIE (reactive ion etching) is performed to form a gate electrode 29A as a side wall on the inner wall of the trench 27A and a gate electrode 29B as a side wall on the inner wall of the trench 27B as shown in FIG. 20.

Process 7: The gate insulation film 28 formed on the upper surface of the n-type epitaxial silicon layer 25 is removed. Then, a resist pattern closing the openings of the trenches 27A and 27B is formed by performing photolithography as indicated by broken lines in FIG. 21. Arsenic is ion-implanted into the upper surface of the n-type epitaxial silicon layer 25 through the resist pattern and activated by a heat treatment. As a result, an n-type drain diffusion layer 30 is formed on the upper surface of the n-type epitaxial silicon layer 25.

Figure 22:
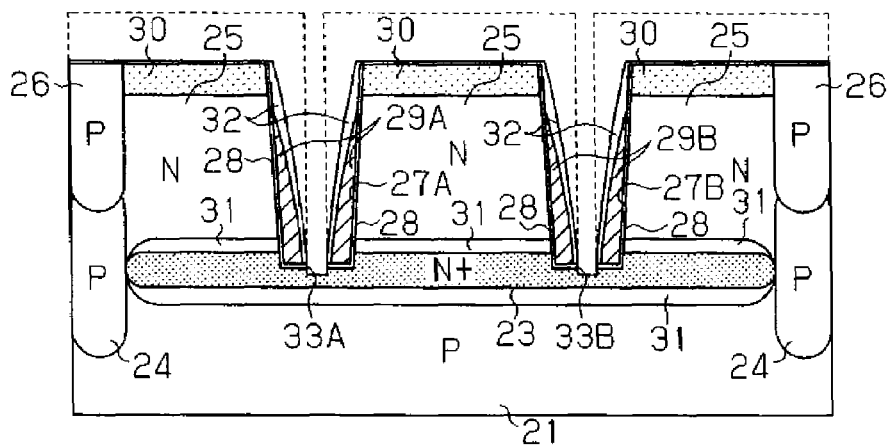

Process 8: As shown in FIG. 22, an interlayer insulation film 32 is deposited to have a thickness of approximately 1000 angstroms from above the n-type epitaxial silicon layer 25 by performing, for example, LP-CVD using TEOS. More specifically, the interlayer insulation film 32 is formed to cover the upper surface of the drain diffusion layer 30, the surfaces of the gate electrodes 29A and 29B, and the upper surfaces of the gate insulation films 28 formed on the bottom surfaces of the trenches 27A and 27B. Afterwards, a resist pattern having an opening corresponding to an area between the opposing portions of the gate electrode 29A in the trench 27A and an opening corresponding to an area between the opposing portions of the gate electrode 29B in the trench 27B is formed as indicated by broken lines in FIG. 22. Etching is performed through this resist pattern so that the bottom surfaces of the trenches 27A and 27B are cut out and grooves 33A and 33B are formed in the bottom surfaces of the trenches 27A and 27B. The grooves 33A and 33B are formed so that they do not extend through the n-type buried diffusion layer 23. This forms the grooves 33A and 33B that extend from the bottom surfaces of the trenches 27A and 27B, in which the gate electrodes 29A and 29B are embedded, to the n-type buried diffusion layer 23.

Figure 23:
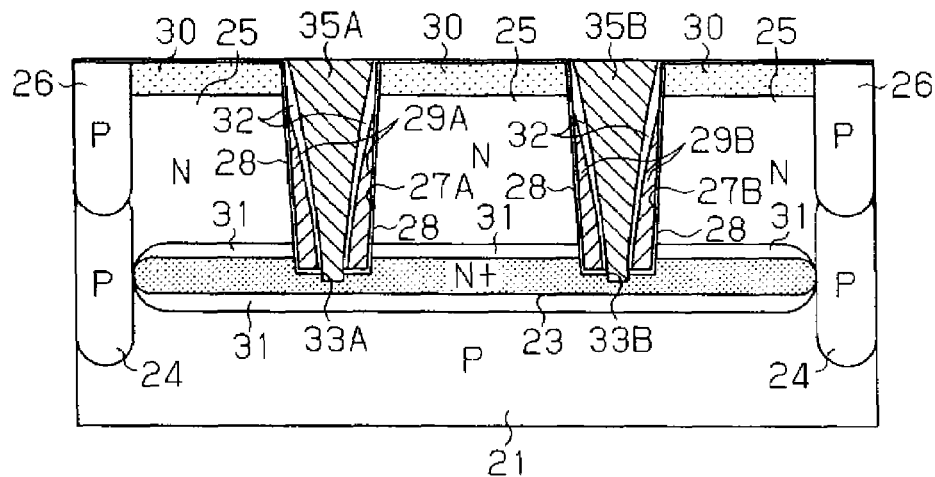

Process 9: As shown in FIG. 23, a barrier metal of titanium nitride or the like is formed. Then, tungsten is deposited in the trenches 27A and 27B and in the grooves 33A and 33B by performing CVD using tungsten hexafluoride gas. By performing photolithography and etching, a source lead electrode 35A is formed in an inner portion of the trench 27A that is inward from the gate electrode 29A and in an inner portion of the groove 33A, and a source lead electrode 35B is formed in an inner portion of the trench 27B that is inward from the gate electrode 29B and in an inner portion of the groove 33B. This forms the source lead electrodes 35A and 35B that are connected to the n-type buried diffusion layer 23 through the inner portions of the trenches 27A and 27B inward from the gate electrodes 29A and 29B and the inner portions of the grooves 33A and 33B.

Figure 24:
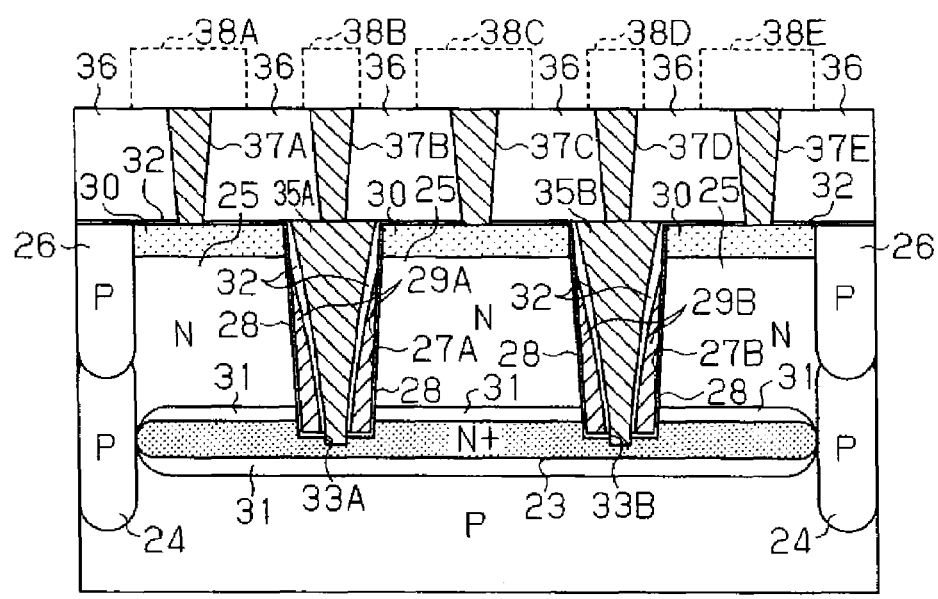

Process 10: As shown in FIG. 24, an interlayer insulation film 36 is formed on the n-type epitaxial silicon layer 25 by performing, for example, HDP-CVD. Afterwards, contact holes extending to the drain diffusion layer 30 and the source lead electrodes 35A and 35B are formed in the interlayer insulation film 36. Tungsten is deposited in the contact holes by performing CVD using tungsten hexafluoride gas and is then etched back to form contact plugs 37A to 37E in the contact holes. As indicated by broken lines, a laminated film of TiN/Al—Cu/TiN is deposited to have a total film thickness of approximately 5000 angstroms by performing sputtering and then subjected to photolithography and etching to form metal wires 38A to 38E that are electrically connected to the contact plugs 37A to 37E, respectively. The semiconductor device of the second embodiment also uses aluminum as the material for the metal wires 38A to 38E. The main structure of the semiconductor device of the second embodiment is completed through the processes described above.

Figure 25:
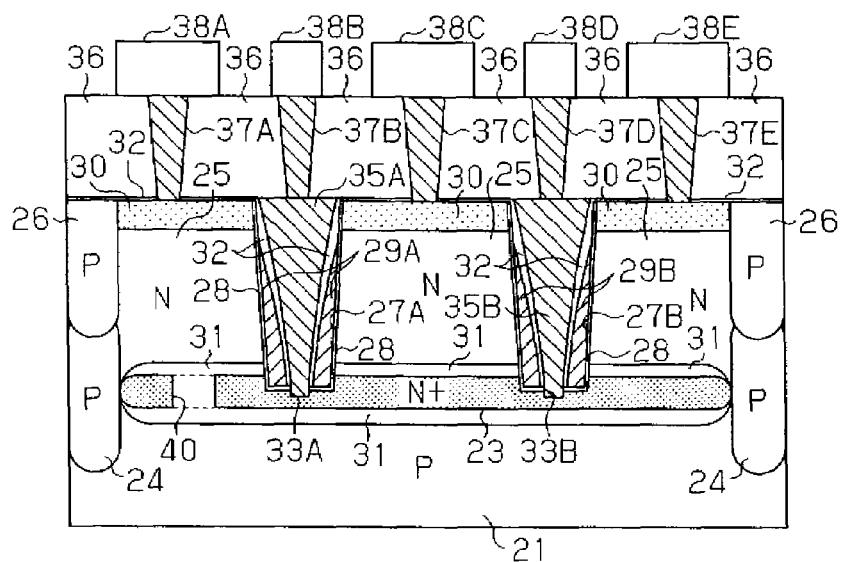
FIG. 25 is a cross-sectional view showing a modification of the semiconductor device shown in FIG. 24.

During actual use, the DMOSFETs having the above-described structure may have a problem in which parasitic bipolar transistors may be formed by the n-type epitaxial silicon layer 25, the p-type body diffusion layer 31, and the n-type buried diffusion layer 23. Depending on the noise environment or the like of the semiconductor device, such parasitic bipolar transistors may cause unstable operation of the DMOSFETs. Thus, it is preferable to form a communication opening 40 (e.g., 5 μm☐) in the n-type buried diffusion layer 23 as shown in FIG. 25. When the semiconductor device has this structure, the body diffusion layer 31 formed on the upper surface of the n-type buried diffusion layer 23 is electrically connected to the p-type silicon substrate 21 through the communication opening 40. More specifically, the base potential of each parasitic bipolar transistor formed is clamped to the substrate potential of the p-type silicon substrate 21. As a result, the base potential of each parasitic bipolar transistor is prevented from changing. This consequently stabilizes the operation of each DMOSFET.

The semiconductor device of the second embodiment has the advantages described below.

(4) The body diffusion layer 31, the n-type buried diffusion layer 23, and the body diffusion layer 31 are sequentially formed on the upper surface of the p-type silicon substrate 21, and the n-type epitaxial silicon layer 25 is formed on the body diffusion layer 31. As a result, the planar n-type buried diffusion layer 23 is formed in the semiconductor substrate under the semiconductor element formation region S in which the DMOSFETs are formed. The source lead electrodes 35A and 35B are embedded in the trenches 27A and 27B formed on the n-type epitaxial silicon layer 25 and in the grooves 33A and 33B connecting the bottom surfaces of the trenches 27A and 27B and the n-type buried diffusion layer 23 in a manner that the source lead electrodes 35A and 35B are connected to the n-type buried diffusion layer 23. With this structure, the carriers injected from the metal wires 38B and 38D that are electrically connected to the source lead electrodes 35A and 35B all flow through the n-type buried diffusion layer 23. The semiconductor device with this structure also reduces the wire resistance of each DMOSFET as compared with the conventional semiconductor device in the same manner as in the first embodiment. Further, variations in the wire resistance of the DMOSFETs are suppressed. This reduces uneven distribution of current in the DMOSFETs. The current is prevented from concentrating at a certain portion of the semiconductor device. As a result, the reliability of the semiconductor device is improved.

(5) If the operation of each DMOSFET may become unstable depending on the noise environment or the like of the semiconductor device, the communication opening 40 is formed in the n-type buried diffusion layer 23. In this case, the base potential of a parasitic bipolar transistor that may be generated in each DMOSFET is clamped to the substrate potential of the p-type silicon substrate 21. As a result, the base potential of each parasitic bipolar transistor is prevented from changing. This stabilizes the operation of each DMOSFET.

A semiconductor device according to a third embodiment of the present invention will now be described with reference to FIG. 26. The semiconductor device of the third embodiment is similar to the semiconductor device of the second embodiment.

Figure 26:
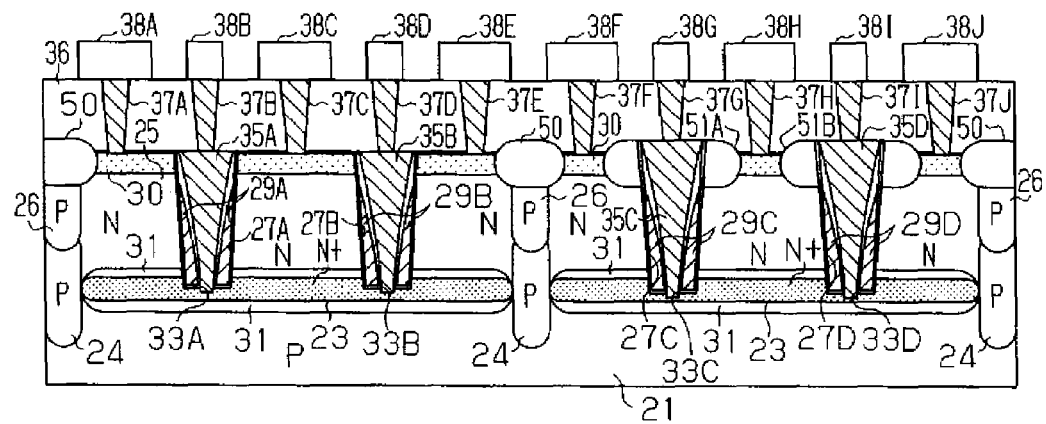
FIG. 26 is a cross-sectional view of a semiconductor device according to a third embodiment of the present invention.

As shown in FIG. 26, the semiconductor device of the third embodiment includes a DMOSFET having a low breakdown voltage and shown at the left side of the drawing and a DMOSFET having a high breakdown voltage and shown at the right side of the drawing. The structure of the DMOSFET having a low breakdown voltage is basically the same as the structure of the DMOSFETs of the second embodiment and will not be described in detail. The structure of the DMOSFET having a high breakdown voltage will now be described.

The semiconductor device includes local oxidation of silicon (LOCOS) layers 50 formed in the upper surface of an n-type epitaxial silicon layer 25. The LOCOS layers 50 and isolation diffusion layers 24 and 26 isolate semiconductor elements of the semiconductor device.

In a portion of the n-type epitaxial silicon layer 25 in which the high breakdown voltage DMOSFET is formed, a LOCOS layer 51A and a LOCOS layer 51B are formed in parallel between the LOCOS layers 50. A trench 27C that extends to an n-type buried diffusion layer 23 is formed in a middle portion of the LOCOS layer 51A and surrounded by the LOCOS layer 51A. A trench 27D that extends to the n-type buried diffusion layer 23 is formed in a middle portion of a LOCOS layer 51B and surrounded by the LOCOS layer 51B. In other words, the LOCOS layers 51A and 51B are formed at the portion of the n-type epitaxial silicon layer 25 in which the high breakdown voltage DMOSFET is formed in a manner that the LOCOS layers 51A and 51B surround the openings of the trenches 27C and 27D, respectively.

In the same manner as in the second embodiment, gate electrodes 29C and 29D are embedded in the inner walls of the trenches 27C and 27D by way of an insulation film made of, for example, silicon dioxide. Grooves 33C and 33D are formed in the bottom surfaces of the trenches 27C and 27D. The grooves 33C and 33D do not extend through the n-type buried diffusion layer 23. Source lead electrodes 35C and 35D are embedded in the semiconductor substrate in a manner that the source lead electrodes 35C and 35D are connected to the n-type buried diffusion layer 23 through inner portions of the trenches 27C and 27D that are inward from the gate electrodes 29C and 29D and inner portions of the grooves 33C and 33D.

Contact plugs 37F, 37H, and 37J, which are connected to a portion of the drain diffusion layer 30 in which the high breakdown voltage DMOSFET is formed, and contact plugs 37G and 37I, which are connected to the source lead electrodes 35C and 35D, are embedded in the interlayer insulation film 36. Metal wires 38F to 38J connected to the contact plugs 37F to 37J are formed on the upper surface of the interlayer insulation film 36.

In the high breakdown voltage DMOSFET, injected carriers flow along the periphery of the LOCOS layer 51A and the LOCOS layer 51B. This lengthens the carrier passage from the body diffusion layer 31 to the drain diffusion layer 30 as compared with the low breakdown voltage DMOSFET. As a result, the breakdown voltage of the DMOSFET increases.

When this DMOSFET, the length of the carrier passage from the body diffusion layer 31 to the drain diffusion layer 30, or the distance of the drift layer, is changed by changing the length (width) of the LOCOS layers 51A and 51B along the surface of the semiconductor substrate. Thus, a change in the width of the LOCOS layers 51A and 51B enables DMOSFETs with any breakdown voltage to be formed while the n-type epitaxial silicon layer 25 has the same thickness. This enables DMOSFETs having different breakdown voltages to be mounted on the same semiconductor substrate.

The semiconductor device of the third embodiment has the advantages described below.

(6) The LOCOS layers 51A and 51B are formed on the upper surface of the n-type epitaxial silicon layer 25, and the trenches 27C and 27D are formed in the middle portions of the LOCOS layers 51A and 51B, respectively. In the portion of the n-type epitaxial silicon layer 25 in which the high breakdown voltage DMOSFET is formed, the openings of the trenches 27C and 27D are surrounded by the LOCOS layers 51A and 51B, respectively. With this structure, the injected carriers flow along the periphery of the LOCOS layer 51A and the LOCOS layer 51B so as to lengthen the carrier passage from the body diffusion layer 31 to the drain diffusion layer 30 and improve the breakdown voltage of each DMOSFET. By changing the length (width) of the LOCOS layers 51A and 51B along the surface of the semiconductor substrate, the distance of the drift layer changes. Thus, the width of the LOCOS layers 51A and 51B may be changed to form a DMOSFETs with any breakdown voltage while the n-type epitaxial silicon layer 25 has the same thickness. This enables DMOSFETs having different breakdown voltages to be formed on the same semiconductor substrate.

A semiconductor device according to a fourth embodiment of the present invention will now be described. The semiconductor device of the fourth embodiment is similar to the semiconductor device of the first embodiment. In the semiconductor device of the fourth embodiment, trenches 7A and 7B are formed after a source diffusion layer 10 and a body diffusion layer 11 are formed on an n-type epitaxial silicon layer 5. This improves the reliability of the semiconductor device. The semiconductor device of the fourth embodiment will now be described with reference to FIGS. 27 to 30. Components in the semiconductor device of the fourth embodiment similar to the components of the semiconductor device in the first embodiment will not be described.

In the processes for manufacturing the semiconductor device in the first embodiment, the trenches 7A and 7B and gate insulation films 8 are formed in process 5, and then arsenic and boron are ion-implanted by means of a resist pattern to form the source diffusion layer 10 and the body diffusion layer 11 in process 7. When the semiconductor device is manufactured through these processes, a misalignment of the resist pattern may occur in process 7. This may result in arsenic and boron also being ion-implanted into the gate insulation films 8. In this case, the performance of the gate insulation films 8 may decrease. This would lower the reliability of the semiconductor device. To prevent such a circumstance, the shape of the resist pattern may be changed to entirely cover the gate insulation films 8. However, in this case, arsenic and boron may be incompletely ion-implanted into the vicinity of the boundary between the n-type epitaxial silicon layer 5 and the trenches 7A and 7B. In this case, the self-alignment function may not be effective.

The semiconductor device of the fourth embodiment may be manufactured through a process of forming an impurity diffusion layer on an upper surface of a support substrate that is formed by a semiconductor, a process of forming an epitaxial semiconductor layer on the upper surface of the support substrate on which the impurity diffusion layer has been formed, a process of forming a source diffusion layer and a body diffusion layer by ion-implantation into the epitaxial semiconductor layer, a process of forming a trench on an upper surface of the epitaxial semiconductor layer, a process of forming a gate insulation film on an inner wall of the trench, a process of embedding a gate electrode in the inner wall of the trench, a process of forming a groove extending from a bottom surface of the trench in which the gate electrode is embedded to the impurity diffusion layer, a process of embedding a conductor in a manner that the conductor is connected to the impurity diffusion layer through an inner portion of the trench that is inward from the gate electrode and an inner portion of the groove, a process of forming a conductive layer adjacent to the trench on the upper surface of the epitaxial semiconductor layer, and a process of connecting the source electrode to one of the conductor and the conductive layer and the drain electrode to the other one of the conductor and the conductive layer.

With this manufacturing method, an impurity diffusion layer is first formed on an upper surface of a support substrate that is formed by a semiconductor, and an epitaxial semiconductor layer is formed on the upper surface of the support substrate. Afterwards, a source diffusion layer and a body diffusion layer are formed on the epitaxial semiconductor layer. Further, a trench is formed on an upper surface of the epitaxial semiconductor layer. A gate insulation film is formed on an inner wall of the trench. With this manufacturing method, ion-implantation is performed on the epitaxial semiconductor layer to form the source diffusion layer and the body diffusion layer. Then, the gate insulation film is formed on the inner wall of the trench. Thus, impurities are prevented from being ion-implanted into the gate insulation film. This improves the reliability of the semiconductor device. Afterwards, a conductor is embedded in a manner that the conductor is connected to the impurity diffusion layer through an inner portion of a groove that extends from the bottom surface of the trench formed on the upper surface of the epitaxial semiconductor layer and reaches the impurity diffusion layer. As a result, a wiring layer is formed in the semiconductor substrate that is formed by the support substrate and the epitaxial semiconductor layer. A gate electrode is embedded in the inner wall of the trench and a source electrode is connected to one of a conductive layer formed adjacent to the trench on the upper surface of the epitaxial semiconductor layer and the conductor and a drain electrode is connected to the other one of the conductive layer and the conductor.

The manufacturing processes for the semiconductor device will now be described in detail. The semiconductor device of the fourth embodiment is manufactured through processes 1 to 4 for the semiconductor device of the first embodiment, processes 5 to 7 as described below, and processes 8 to 11 for the semiconductor device of the first embodiment. More specifically, the semiconductor device of the fourth embodiment is manufactured by replacing processes 5 to 7 for the semiconductor device of the first embodiment with processes 5 to 7 described below. Processes 1 to 4 and processes 8 to 11 of the semiconductor device of the fourth embodiment common to the first embodiment will not be described in detail, and only processes 5 to 7 will be described.

Figure 27:
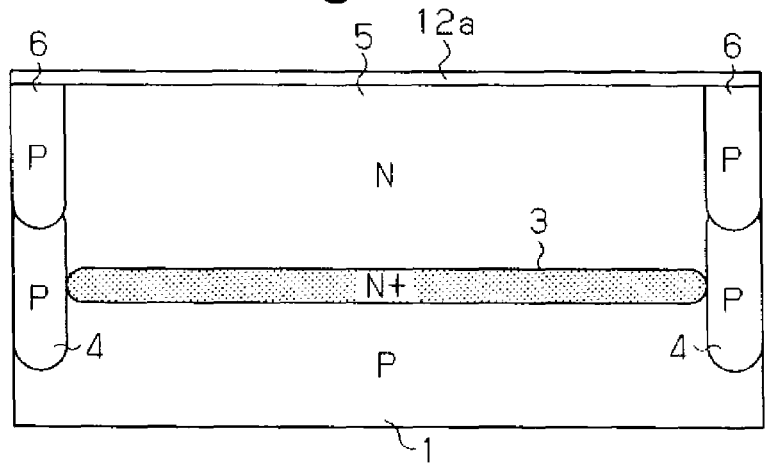
FIGS. 27 to 30 are cross-sectional views of a semiconductor device according to a fourth embodiment of the present invention showing various procedures during its manufacturing process.
Figure 28:
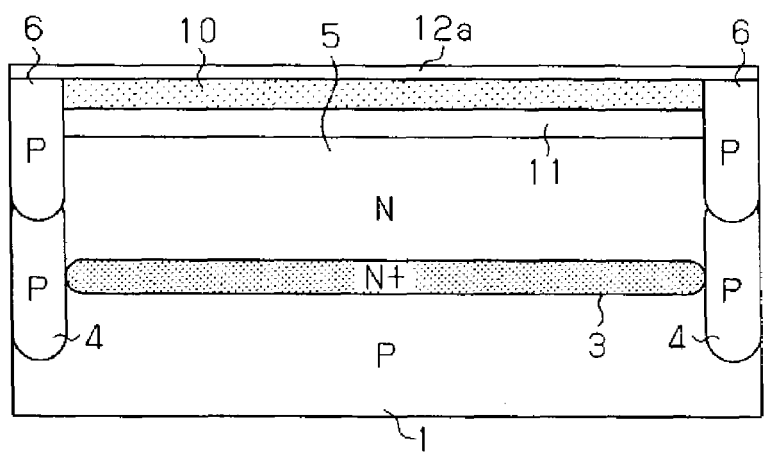

Process 5: After processes 1 to 4 described in the first embodiment, an interlayer insulation film 12a is deposited to have a thickness of approximately 1000 angstroms by performing, for example, LP-CVD using TEOS as shown in FIG. 27. Arsenic is ion-implanted into the n-type epitaxial silicon layer 5 through the interlayer insulation film 12a, and boron is ion-implanted into the n-type epitaxial silicon layer 5 at a position deeper than the position at which arsenic has been implanted. Afterwards, the implanted elements are activated by a heat treatment. As a result, an n-type source diffusion layer 10 and a p-type body diffusion layer 11 serving as a base layer of the source diffusion layer 10 are formed on the n-type epitaxial silicon layer 5 as shown in FIG. 28.

Figure 29:
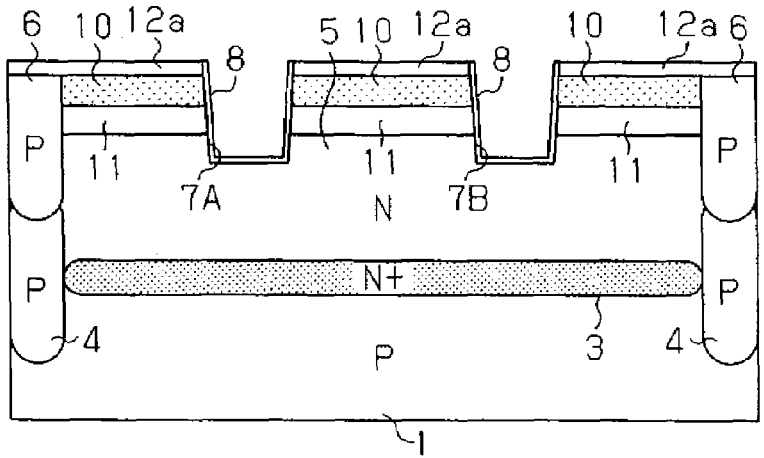

Process 6: As shown in FIG. 29, trenches 7A and 7B having a width of approximately 1.5 micrometers and a depth of approximately 1 micrometer are formed on the upper surface of the n-type epitaxial silicon layer 5 by performing photolithography and etching. Afterwards, the surface of a silicon substrate formed by the n-type epitaxial silicon layer 5 is thermally oxidized to form gate insulation films 8 having a thickness of approximately 150 angstroms. When there is a possibility of the gate insulation films 8 causing the surface profile of the source diffusion layer 10 to deteriorate, it is preferable that an oxidation film be formed on the surface of the source diffusion layer 10 in a separate process before the gate insulation film 8 is formed.

Figure 30:
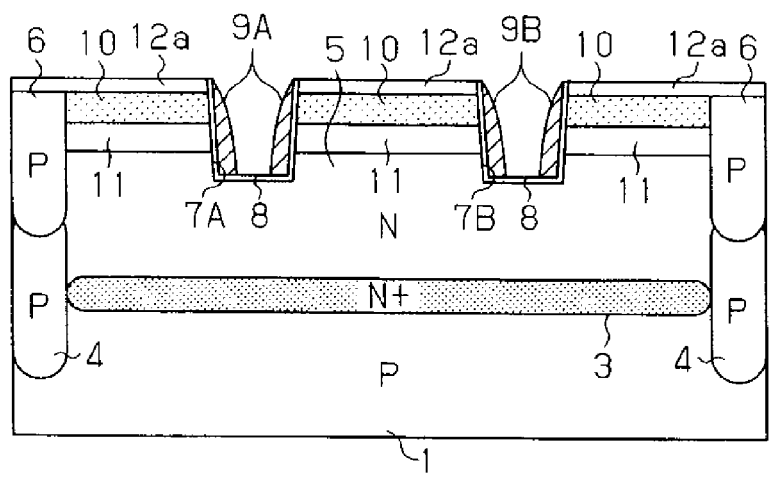

Process 7: Polysilicon is deposited in the trenches 7A and 7B to a thickness of approximately 2000 angstroms and then subjected to heat treatment using a phosphor source such as POCl$_3$ to dope the polysilicon with phosphorous. Afterwards, anisotropic RIE (reactive ion etching) is performed to form a gate electrode 9A as a side wall on the inner wall of the trench 7A and a gate electrode 9B as a side wall on the inner wall of the trench 7B as shown in FIG. 30.

Then, processes 8 to 11 for the semiconductor device of the first embodiment are performed to complete the main structure of the semiconductor device of the fourth embodiment.

The semiconductor device of the fourth embodiment has the advantages described below.

(7) After the source diffusion layer 10 and the body diffusion layer 11 are formed on the n-type epitaxial silicon layer 5, the trenches 7A and 7B are formed on the upper surface of the n-type epitaxial silicon layer 5. The gate insulation films 8 are formed on the inner walls of the trenches 7A and 7B. More specifically, after ion-implantation is performed on the n-type epitaxial silicon layer 5 to form the source diffusion layer 10 and the body diffusion layer 11, the gate insulation films 8 are formed on the inner walls of the trenches 7A and 7B. In this case, impurities are prevented from being ion-implanted into the gate insulation film 8, and the performance of the gate insulation film 8 is prevented from being lowered. As a result, the reliability of the semiconductor device is improved.

A semiconductor device according to a fifth embodiment of the present invention will now be described. The semiconductor device of the fifth embodiment is similar to the semiconductor device of the first embodiment. However, in the semiconductor device of the fifth embodiment, the interlayer insulation film 14 formed above the trenches 7A and 7B is formed to be thicker during the manufacturing processes. This enables elimination of the photolithography process that forms the grooves 13A and 13B. The manufacturing method of the semiconductor device in the fifth embodiment reduces the manufacturing cost of the semiconductor device. The semiconductor device of the fifth embodiment will now be described with reference to FIGS. 31 to 36. Components in the semiconductor device of the fifth embodiment similar to components in semiconductor device of the first embodiment will not be described in detail.

The semiconductor device of the fifth embodiment may be manufactured through a process of forming an impurity diffusion layer on an upper surface of a support substrate that is formed by a semiconductor, a process of forming an epitaxial semiconductor layer on the upper surface of the support substrate on which the impurity diffusion layer has been formed, a process of forming a first interlayer insulation film on an upper surface of the epitaxial semiconductor layer, a process of forming a trench on the upper surface of the epitaxial semiconductor layer, a process of forming a gate insulation film on an inner wall of the trench, a process of embedding a gate electrode in the inner wall of the trench in a manner that a top end of the gate electrode is located closer to a bottom surface side of the trench than the surface of the first interlayer insulation film, a process of forming a second interlayer insulation film on the surface of the first interlayer insulation film and on the surface of the gate electrode, a process of forming a groove that extends from a bottom surface of the trench in which the gate electrode is embedded to the impurity diffusion layer, a process of embedding a conductor in a manner that the conductor is connected to the impurity diffusion layer through an inner portion of the trench that is inward from the gate electrode and an inner portion of the groove, a process of forming a conductive layer adjacent to the trench on the upper surface of the epitaxial semiconductor layer, and a process of connecting the source electrode to one of the conductor and the conductive layer and the drain electrode to the other one of the conductor and the conductive layer.

With this manufacturing method, an impurity diffusion layer is first formed on an upper surface of a support substrate that is formed by a semiconductor, and an epitaxial semiconductor layer is formed on the upper surface of the support substrate. A trench is formed on an upper surface of the epitaxial semiconductor layer after a first interlayer insulation film is formed on the upper surface of the epitaxial semiconductor layer. A gate electrode is embedded in an inner wall of the trench on which a gate insulation film is formed in a manner that a top end of the gate electrode located closer to a bottom surface side of the trench than the surface of the first interlayer insulation film, that is, at a position deeper than the surface position of the first interlayer insulation film. Afterwards, a second interlayer insulation film is formed on the surface of the first interlayer insulation film and on the surface of the gate electrode. As a result, a thick insulation film formed by the first and second interlayer insulation films is formed on the surface of the epitaxial semiconductor layer. The thick insulation film and the second interlayer insulation film formed on the surface of the gate electrode are used as a mask pattern to form a groove that extends from the bottom surface of the trench to the impurity diffusion layer. This structure eliminates the photolithography process, and consequently reduces the manufacturing cost of the semiconductor device. Afterwards, a conductor is embedded in an inner portion of the groove that extends from the bottom surface of the trench to the impurity diffusion layer in a manner that the conductor is connected to the impurity diffusion layer. As a result, the wiring layer is formed in a semiconductor substrate that is formed by the support substrate and the epitaxial semiconductor layer. A gate electrode is embedded in an inner wall of the trench, and a source electrode is connected to one of a conductive layer formed adjacent to the trench on the upper surface of the epitaxial semiconductor layer and the conductor and a drain electrode is connected to the other one of the conductive layer and the conductor.

The manufacturing processes of the semiconductor device will now be described. The semiconductor device of the fifth embodiment is manufactured through processes 1 to 4 for the semiconductor device of the first embodiment, processes 5 to 9 as described below, and processes 10 and 11 for the semiconductor device of the first embodiment. More specifically, the semiconductor device of the fifth embodiment is manufactured through the manufacturing processes obtained by replacing processes 5 to 9 of the semiconductor device of the first embodiment with processes 5 to 9 described below. Processes 1 to 4 and processes 10 and 11 of the semiconductor device of the fifth embodiment common to the first embodiment will not be described in detail, and only processes 5 to 9 will be described.

Figure 31:
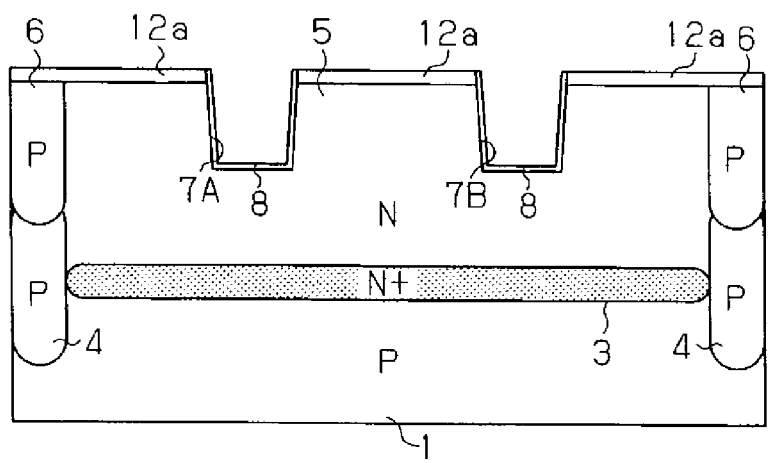
FIGS. 31 to 36 are cross-sectional views of a semiconductor device according to a fifth embodiment of the present invention showing various procedures during its manufacturing process.

Process 5: After processes 1 to 4 described in the first embodiment are performed, an interlayer insulation film 12a is deposited to have a thickness of approximately 1000 angstroms by performing, for example, LP-CVD using TEOS as shown in FIG. 31. Trenches 7A and 7B having a width of approximately 1.5 micrometer and a depth of approximately 1 micrometer are formed on the surface of an n-type epitaxial silicon layer 5 by performing photolithography and etching. Afterwards, the surface of a silicon substrate that may be formed by the n-type epitaxial silicon layer 5 is thermally oxidized to form gate insulation films 8 having a thickness of approximately 150 angstroms.

Figure 32:
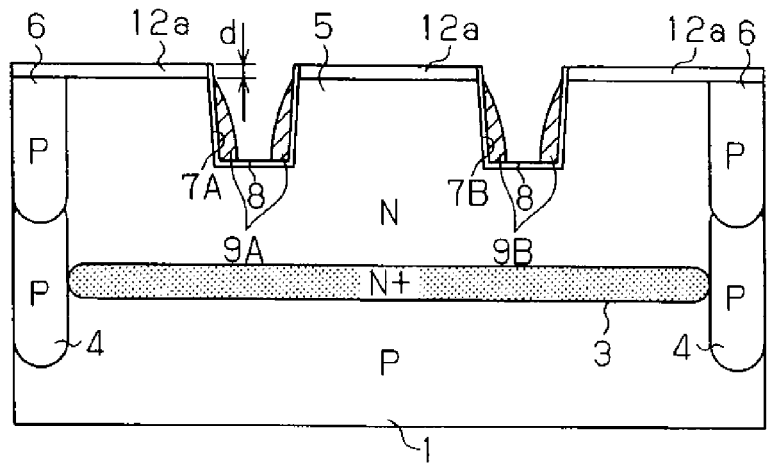
Figure 33:
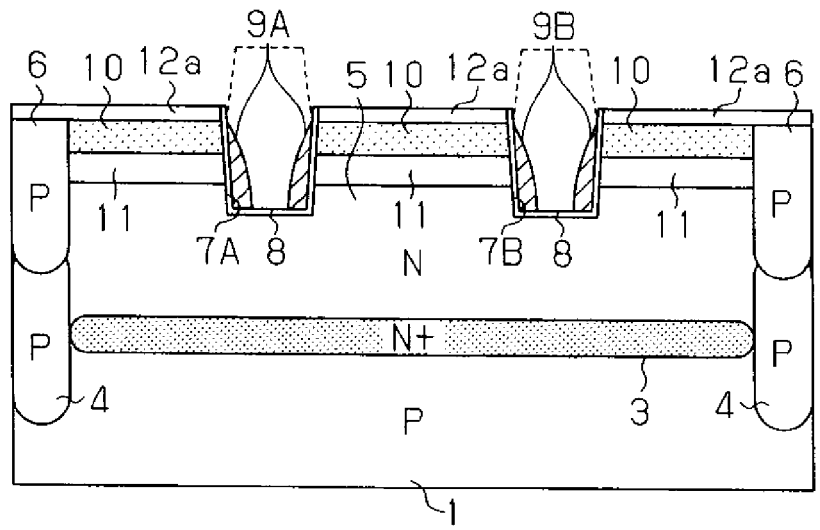

Process 6: Polysilicon is deposited in the trenches 7A and 7B to have a thickness of approximately 2000 angstroms and then subjected to heat treatment using a phosphor source such as $POCl_3$ to dope the polysilicon with phosphorous. Afterwards, anisotropic RIE is performed to form a gate electrode 9A as a side wall on the inner wall of the trench 7A and a gate electrode 9B as a side wall on the inner wall of the trench 7B as shown in FIG. 32. As shown in FIG. 32, the gate electrodes 9A and 9B are formed in a manner that top ends of the gate electrodes 9A and 9B are located at positions lower by depth d from the surface of the interlayer insulation film 12a.

Process 7: As indicated by broken lines in FIG. 33, a resist pattern that closes the openings of the trenches 7A and 7B is formed by performing photolithography. Arsenic is ion-implanted into the upper surface of the n-type epitaxial silicon layer 5 through this resist pattern, and boron is ion-implanted at a position deeper than the position at which arsenic has been implanted. Afterwards, the implanted elements are activated by a heat treatment. As a result, an n-type source diffusion layer 10 and a p-type body diffusion layer 11 serving as a base layer of the source diffusion layer 10 are formed on the n-type epitaxial silicon layer 5.

Figure 34:
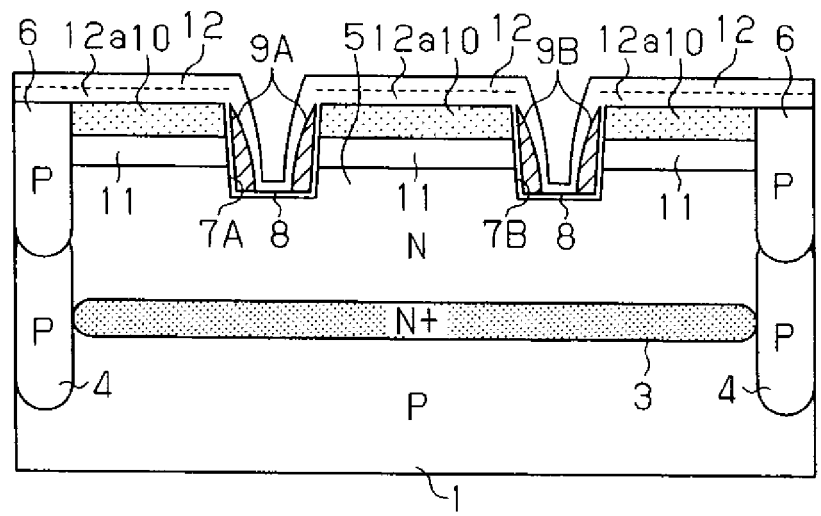
Figure 35:
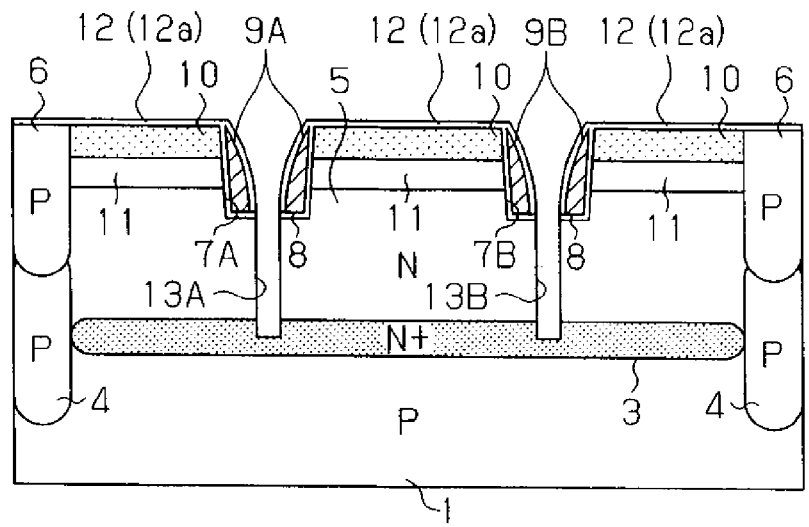

Process 8: As shown in FIG. 34, an interlayer insulation film 12 is deposited to have a thickness of approximately 1000 angstroms by performing, for example, LP-CVD using TEOS. As a result, a thick insulation film formed by the interlayer insulation film 12a and the interlayer insulation film 12 is formed on the surface of the silicon substrate. Afterwards, anisotropic RIE is performed to remove portions of the interlayer insulation film 12 from the bottom surfaces of the trenches 7A and 7B as shown in FIG. 35. The interlayer insulation films 12 and 12a formed on the surface of the silicon substrate and the interlayer insulation film 12 formed on the surfaces of the gate electrodes 9A and 9B are used as a mask pattern, and grooves 13A and 13B are formed to have a depth of approximately 1 micrometer in a manner that the grooves 13A and 13B extend from the bottom surfaces of the trenches 7A and 7B to the n-type buried diffusion layer 3. This forms the grooves 13A and 13B that extend from the bottom surfaces of the trenches 7A and 7B in which the gate electrodes 9A and 9B are embedded to the n-type buried diffusion layer 3.

Figure 36:
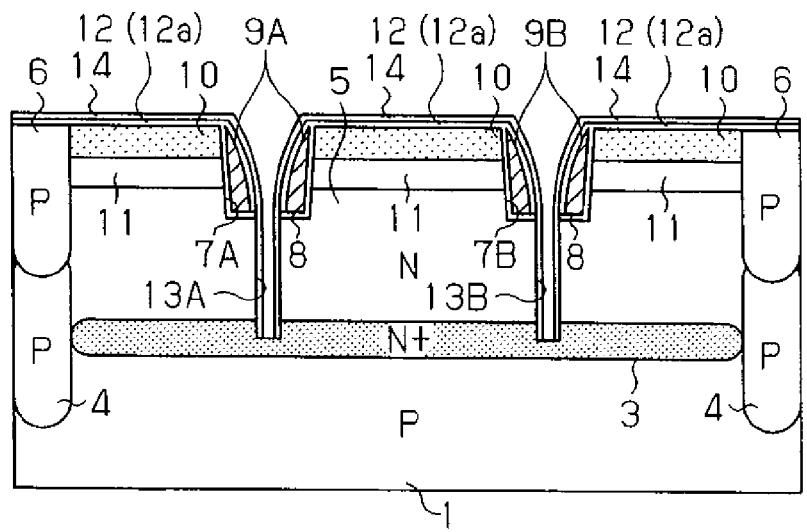

Process 9: As shown in FIG. 36, an interlayer insulation film 14 is deposited to have a thickness of approximately 1000 angstroms by performing, for example, LP-CVD using TEOS. More specifically, the interlayer insulation film 14 is formed on the upper surface of the interlayer insulation film 12, the inner walls of the grooves 13A and 13B, and the bottom surfaces of the grooves 13A and 13B. Afterwards, anisotropic etching is performed to remove portions of the interlayer insulation film 14 from the bottom surfaces of the grooves 13A and 13B.

Afterwards, processes 10 and 11 for the semiconductor device of the first embodiment are performed to complete the main structure of the semiconductor device of the fifth embodiment.

In the fifth embodiment, the interlayer insulation film 12a corresponds to an interlayer insulation film, and the interlayer insulation film 12 corresponds to a second interlayer insulation film.

The semiconductor device of the fifth embodiment has the advantages described below.

(8) After the interlayer insulation film 12a is formed on the upper surface of the n-type epitaxial silicon layer 5, the trenches 7A and 7B are formed on the upper surface of the n-type epitaxial silicon layer 5. The gate electrodes 9A and 9B are embedded in the inner walls of the trenches 7A and 7B on which the gate insulation film 8 is formed in a manner that the top ends of the gate electrodes 9A and 9B are located at positions lower by depth d from the surface of the interlayer insulation film 12a. The interlayer insulation film 12 is formed on the surface of the interlayer insulation film 12a and the surfaces of the gate electrodes 9A and 9B. As a result, the thick insulation film formed by the interlayer insulation films 12a and 12 is formed on the surface of the n-type epitaxial silicon layer 5. Thus, this thick insulation film and the interlayer insulation film 12 formed on the surfaces of the gate electrodes 9A and 9B are used as a mask pattern to form the grooves 13A and 13B from the bottom surfaces of the trenches 7A and 7B to the n-type buried diffusion layer 3. This eliminates the photolithography process, and consequently reduces the manufacturing cost of the semiconductor device.

It should be apparent to those skilled in the art that the present invention may be embodied in many other specific forms without departing from the spirit or scope of the invention. Particularly, it should be understood that the present invention may be embodied in the following forms.

The structure of the semiconductor device in the second embodiment may be changed or improved in accordance with the conditions under which the semiconductor device is used. For example, a circuit that drives a load, such as a motor, typically employs an H-bridge formed by connecting power transistors to an upstream side (power supply side) and a downstream side (ground side) of the motor in a passage for supplying a current to the motor. In the H-bridge, a high-side switch transistor that is arranged at the power supply side and a low-side switch transistor that is arranged at the ground side differ greatly from each other in the mode of voltage applied to their sources. More specifically, the source of the low-side switch transistor is clamped to a ground potential (low level), whereas the source of the high-side switch transistor is either a high level potential or a ground potential. As a result, in the prior art, this type of drive circuit must form the high-side switch transistor and the low-side switch transistor on separate semiconductor substrates. In contrast, the semiconductor device of the present invention enables the high-side switch transistor and the low-side switch transistor to be formed on the same semiconductor substrate. More specifically, as shown in FIG. 37, the semiconductor device of the third embodiment may have a p-type silicon substrate 21 divided into two layers, and an n-type buried diffusion layer 61 may be formed between the two layers, and an isolation layer may be formed by isolation diffusion layers 62 and 63 that extend from the two ends of the n-type buried diffusion layer 61 to the n-type epitaxial silicon layer 25. This enables the high-side switch transistor and the low-side switch transistor to be integrated on the same semiconductor substrate, and miniaturizes the semiconductor elements or reduces the cost of the semiconductor elements.

Although tungsten having a low electric resistance is used as the material for the drain lead electrodes 15A and 15B in the above embodiments, polysilicon having a high compatibility with the semiconductor material may be used instead.

In the above embodiments, the n-type buried diffusion layer 3 (23) serving as the impurity diffusion layer functions as a wiring layer. It is only required that the wiring layer be formed from a conductive material. The wiring layer should not be limited to the impurity diffusion layer. The wiring layer may be, for example, a metal layer embedded in the p-type silicon substrate 1 (21).

In the above embodiments, the first dimension L of the n-type buried diffusion layer 3 (23) measured in the arrangement direction of the semiconductor elements and the second dimension W of the n-type buried diffusion layer 3 (23) measured in the extension direction of the trenches 7A and 7B (27A to 27D) satisfy the expression W/L<1. Formation of the n-type buried diffusion layer 3 (23) satisfying this expression effectively reduces uneven distribution of current in the DMOSFETs. Thus, it is preferred that the relationship between the first dimension L and the second dimension W satisfy the expression W/L<1 to obtain the advantages of the present invention. However, an n-type buried diffusion layer 3 (23) satisfying the expression of W/L=1 also reduces uneven distribution of current in the semiconductor elements as compared with the conventional semiconductor device.

The present invention is not limited to a semiconductor device having a structure using vertical DMOSFETS, and may be applied to a structure using horizontal DMOSFETs. The present invention may also be applied to a semiconductor device in which different kinds of semiconductor elements are integrated.

The present examples and embodiments are to be considered as illustrative and not restrictive, and the invention is not to be limited to the details given herein, but may be modified within the scope and equivalence of the appended claims.

What is claimed is:

1. A semiconductor device comprising:
a semiconductor substrate having a surface;
a trench formed in the surface of the semiconductor substrate;
a conductor embedded in the trench;
a conductive layer arranged adjacent to the trench on the surface of the semiconductor substrate;
a plurality of semiconductor elements including sources provided by one of the conductor and the conductive layer and drains provided by the other one of the conductor and the conductive layer;
a semiconductor element formation region for forming the plurality of semiconductor elements therein; and
a planar wiring layer embedded in the semiconductor substrate under the entire semiconductor element formation region and connected to the conductor.

2. The semiconductor device according to claim 1, further comprising:
a plurality of metal wires arranged on the semiconductor substrate and including a first metal wire connected to the conductor and a second metal wire connected to the conductive layer, wherein the first metal wire has a wire width that is narrower than that of the second metal wire.

3. The semiconductor device according to claim 1, wherein:
the plurality of semiconductor elements are arranged in a first direction;
the trench extends in a second direction; and
the planar wiring layer has a first dimension measured in the first direction and a second dimension measured in the second direction, and a ratio of the second dimension to the first dimension is one or less.

4. The semiconductor device according to claim 3, wherein the planar wiring layer is rectangular.

5. The semiconductor device according to claim 1, wherein the conductor has a lower end that terminates in the planar wiring layer.

6. The semiconductor device according to claim 1, wherein the conductor is one of more than two conductors each having a lower end, and the planar wiring layer is a single layer that electrically and mutually connects the lower ends of the more than two conductors.

7. The semiconductor device according to claim 6, wherein the planar wiring layer is located at a constant depth as measured in a depth direction from the surface of the semiconductor substrate.

8. The semiconductor device according to claim 7, wherein the lower ends of the more than two conductors do not extend through the planar wiring layer.

9. A semiconductor device comprising:
a semiconductor substrate having a surface;
a trench formed in the surface of the semiconductor substrate;
a gate electrode embedded in the trench;
a conductor embedded inward from the gate electrode;
a conductive layer arranged adjacent to the trench on the surface of the semiconductor substrate;
a plurality of semiconductor elements including sources provided by one of the conductor and the conductive layer and drains provided by the other one of the conductor and the conductive layer;
a semiconductor element formation region for forming the plurality of semiconductor elements therein; and
a planar wiring layer embedded in the semiconductor substrate under the entire semiconductor element formation region and connected to the conductor.

10. The semiconductor device according to claim 9, further comprising:
a plurality of metal wires arranged on the semiconductor substrate and including a first metal wire connected to the conductor and a second metal wire connected to the conductive layer, wherein the first metal wire has a wire width that is narrower than that of the second metal wire.

11. The semiconductor device according to claim 9, wherein:
the plurality of semiconductor elements are arranged in a first direction;
the trench extends in a second direction; and
the planar wiring layer has a first dimension measured in the first direction and a second dimension measured in the second direction, and a ratio of the second dimension to the first dimension is one or less.

12. The semiconductor device according to claim 11, wherein the planar wiring layer is rectangular.

13. The semiconductor device according to claim 9, wherein the conductor has a lower end that terminates in the planar wiring layer.

14. The semiconductor device according to claim 9, wherein the conductor is one of more than two conductors each having a lower end, and the planar wiring layer is a single layer that electrically and mutually connects the lower ends of the more than two conductors.

15. The semiconductor device according to claim 14, wherein the planar wiring layer is located at a constant depth as measured in a depth direction from the surface of the semiconductor substrate.

16. The semiconductor device according to claim 15, wherein the lower ends of the more than two conductors do not extend through the planar wiring layer.

* * * * *